United States Patent
Kozakai et al.

(10) Patent No.: US 11,114,749 B2
(45) Date of Patent: Sep. 7, 2021

(54) COMMUNICATION APPARATUS AND METHOD, ANTENNA APPARATUS, AND COMMUNICATION SYSTEM

(71) Applicant: Sony Corporation, Tokyo (JP)

(72) Inventors: Osamu Kozakai, Kanagawa (JP); Takaaki Hashiguchi, Tokyo (JP); Hiroyuki Mita, Saitama (JP); Yusuke Yoneyama, Tokyo (JP); Seiji Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 16/072,727

(22) PCT Filed: Jan. 27, 2017

(86) PCT No.: PCT/JP2017/002884
§ 371 (c)(1),
(2) Date: Jul. 25, 2018

(87) PCT Pub. No.: WO2017/138371
PCT Pub. Date: Aug. 17, 2017

(65) Prior Publication Data
US 2019/0044220 A1    Feb. 7, 2019

(30) Foreign Application Priority Data
Feb. 10, 2016    (JP) .............. JP2016-023581

(51) Int. Cl.
*H01Q 1/24*    (2006.01)
*H01Q 1/27*    (2006.01)
(Continued)

(52) U.S. Cl.
CPC ............ *H01Q 1/273* (2013.01); *G01R 33/07* (2013.01); *H01Q 1/38* (2013.01); *H01Q 1/50* (2013.01);
(Continued)

(58) Field of Classification Search
None
See application file for complete search history.

(56) References Cited

U.S. PATENT DOCUMENTS

| | | | |
|---|---|---|---|
| 6,753,819 B1* | 6/2004 | Deinert | H01Q 9/30 340/12.28 |
| 2003/0048223 A1* | 3/2003 | Kezys | H01Q 3/26 342/368 |

(Continued)

FOREIGN PATENT DOCUMENTS

| | | |
|---|---|---|
| JP | 09-018219 A | 1/1997 |
| JP | 2005-354502 A | 12/2005 |

(Continued)

*Primary Examiner* — Trinh V Dinh
(74) *Attorney, Agent, or Firm* — Michael Best & Friedrich LLP

(57) ABSTRACT

A communication apparatus and method, an antenna apparatus, and a communication system that prevent reduced communication characteristics are disclosed. In one example, a coupled antenna element positioned in the vicinity of a communication apparatus is detected, adaptation of impedance is controlled on the basis of the detection result, and wireless communication is performed via the coupled antenna element with the adapted impedance. In addition, an antenna element is excited by a wireless signal from a communication apparatus positioned in the vicinity of the antenna element, and this communication apparatus is notified of being positioned in the vicinity of this antenna element.

18 Claims, 18 Drawing Sheets

(51) Int. Cl.
*H04B 1/3827* (2015.01)
*H01Q 5/378* (2015.01)
*H04B 1/18* (2006.01)
*H04B 1/04* (2006.01)
*H01Q 1/50* (2006.01)
*G01R 33/07* (2006.01)
*H01Q 1/38* (2006.01)
*H03H 7/38* (2006.01)

(52) U.S. Cl.
CPC ............. *H01Q 5/378* (2015.01); *H03H 7/38* (2013.01); *H04B 1/0458* (2013.01); *H04B 1/18* (2013.01); *H04B 1/3827* (2013.01); *H04B 1/385* (2013.01)

(56) References Cited

U.S. PATENT DOCUMENTS

| | | | |
|---|---|---|---|
| 2008/0129610 A1* | 6/2008 | Tsfati | H04B 17/21 343/702 |
| 2012/0007690 A1* | 1/2012 | van Bezooijen | H03H 7/40 333/32 |
| 2012/0051409 A1* | 3/2012 | Brobston | H04B 1/0458 375/222 |
| 2013/0052967 A1* | 2/2013 | Black | H04B 1/0458 455/77 |
| 2016/0154256 A1* | 6/2016 | Yajima | G02B 27/017 600/347 |

FOREIGN PATENT DOCUMENTS

| | | |
|---|---|---|
| JP | 2006-219412 A | 9/2008 |
| JP | 2009-246451 A | 10/2009 |
| JP | 2012-109782 A | 6/2012 |
| JP | 2013-214865 A | 10/2013 |
| JP | 2015-162733 A | 9/2015 |

\* cited by examiner

COMMUNICATION APPARATUS AND METHOD, ANTENNA APPARATUS, AND COMMUNICATION SYSTEM

TECHNICAL FIELD

The present technology relates to communication apparatus and method, an antenna apparatus, and a communication system and, in particular, to communication apparatus and method, an antenna apparatus, and a communication system that are capable of suppressing a reduction in communication characteristics.

BACKGROUND ART

Conventionally, a method has been conceived for a communication apparatus, in which, in order to suppress a reduction in communication characteristics due to impedance misadaptation, electric power at the time of signal transmission/reception is measured and impedance adaptation between an antenna element and a communication circuit is controlled on the basis of a result of the measurement, such that the occurrence of impedance misadaptation when a human body is in proximity is suppressed (for example, refer to Patent Document 1).

Meanwhile, in order to suppress the influence of communication on the human body, a method of shifting an antenna to be used according to a proximity state of the human body has been also conceived (for example, refer to Patent Document 2).

CITATION LIST

Patent Document

Patent Document 1: Japanese Patent Application Laid-Open No. 2005-354502
Patent Document 2: Japanese Patent Application Laid-Open No. 2015-162733

SUMMARY OF THE INVENTION

Problems to be Solved by the Invention

However, since the radiation characteristics of a wireless signal by a communication apparatus fluctuate in the vicinity of a human body, there has been a fear that the communication characteristics of the communication apparatus are reduced. In the method described in Patent Document 1, it is difficult to suppress a reduction in communication characteristics in the vicinity of a human body. In addition, the method described in Patent Document 2 has to provide a plurality of antennas, which not only increases the cost but also, in the case of a compact communication apparatus in which all antennas are positioned in the vicinity of a human body, causes difficulties in suppressing a reduction in communication characteristics.

The present technology has been proposed in view of such a situation and it is an object to suppress a reduction in communication characteristics.

Solutions to Problems

A communication apparatus according to an aspect of the present technology is a communication apparatus that performs wireless communication via an antenna element, the communication apparatus including: a detection unit that detects a coupled antenna element positioned in the vicinity of the communication apparatus; a control unit that controls adaptation of impedance on the basis of a detection result of the coupled antenna element by the detection unit; an adaptation unit that adapts the impedance on the basis of control of the control unit; and a communication unit that performs wireless communication via the antenna element whose impedance has been adapted by the adaptation unit.

The control unit can control adaptation of the impedance so as to match impedance of the antenna element of the communication apparatus with impedance of the communication unit in a case where the detection unit does not detect the coupled antenna element positioned in the vicinity of the communication apparatus, and can control adaptation of impedance so as to match impedance of the antenna element of the communication apparatus and the coupled antenna element with impedance of the communication unit in a case where the detection unit detects the coupled antenna element positioned in the vicinity of the communication apparatus.

The adaptation unit can adjust an inductor, a capacitor, or both the inductor and the capacitor to adapt the impedance.

The detection unit includes a surrounding environment sensor that detects a change in a predetermined parameter relating to an environment around the communication apparatus and, in a case where a change in the parameter is detected by the surrounding environment sensor, can deem that the coupled antenna element positioned in the vicinity of the communication apparatus is detected.

The surrounding environment sensor can be provided therein with a Hall element that detects a change in a magnetic field in the vicinity of the communication apparatus.

The detection unit can be provided with a switch, a connector, or both the switch and the connector that cause an electrical change by the coupled antenna element positioned in the vicinity of the communication apparatus.

A position fixing unit that fixes the communication apparatus at a predetermined position in the vicinity of the coupled antenna element can be further provided.

The position fixing unit can be provided with a magnetic material.

The position fixing unit can fix the communication apparatus such that the antenna element of the communication apparatus and an end portion of the coupled antenna element are brought in proximity to each other.

A communication method according to an aspect of the present technology is a communication method by a communication apparatus that performs wireless communication via an antenna element, the communication method including: detecting a coupled antenna element positioned in the vicinity of the communication apparatus; controlling adaptation of impedance on the basis of a detection result of the coupled antenna element; adapting the impedance on the basis of the control; and performing wireless communication via the antenna element whose impedance has been adapted.

An antenna apparatus according to another aspect of the present technology is an antenna apparatus including: a coupled antenna element excited by a wireless signal from a communication apparatus positioned in the vicinity of the coupled antenna element; and a notification unit that notifies the communication apparatus that the communication apparatus is positioned in the vicinity of the coupled antenna element.

The coupled antenna element can be excited in a non-contact state with the communication apparatus.

An electrical length of the coupled antenna element can be regulated to approximately one-half of a wavelength of the wireless signal.

The notification unit can be provided with a magnet and configured to notify, by a change in a magnetic field, that the communication apparatus is positioned in the vicinity of the coupled antenna element.

The notification unit can be shaped into a physical shape that contacts the communication apparatus to notify the communication apparatus that the communication apparatus is positioned in the vicinity of the coupled antenna element.

An electrical conductor arranged between the coupled antenna element and the communication apparatus, and a human body can be further provided.

A position fixing unit that fixes the communication apparatus at a predetermined position in the vicinity of the coupled antenna element can be further provided.

The position fixing unit can be provided with a magnet.

The position fixing unit can fix the communication apparatus such that the antenna element of the communication apparatus and an end portion of the coupled antenna element are brought in proximity to each other.

A communication system according to still another aspect of the present technology is a communication system including a communication apparatus and an antenna apparatus, in which the antenna apparatus includes: a coupled antenna element excited by a wireless signal from the communication apparatus positioned in the vicinity of the coupled antenna element; and a notification unit that notifies the communication apparatus positioned in the vicinity of the coupled antenna element that the communication apparatus is positioned in the vicinity of the coupled antenna element, and the communication apparatus includes: a detection unit that detects the coupled antenna element positioned in the vicinity of the communication apparatus on the basis of a notification from the notification unit of the antenna apparatus; a control unit that controls adaptation of impedance on the basis of a detection result of the coupled antenna element by the detection unit; an adaptation unit that adapts the impedance on the basis of control of the control unit; and a communication unit that performs wireless communication via an antenna element of the communication apparatus, or the antenna element of the communication apparatus and the coupled antenna element, the impedance of which has been adapted by the adaptation unit.

In the communication apparatus and method according to an aspect of the present technology, a coupled antenna element positioned in the vicinity of the communication apparatus that performs wireless communication via an antenna element is detected, adaptation of impedance is controlled on the basis of a detection result of this coupled antenna element, the impedance is adapted on the basis of this control, and wireless communication is performed via the antenna element whose impedance has been adapted.

In the antenna apparatus according to another aspect of the present technology, a coupled antenna element is excited by a wireless signal from a communication apparatus positioned in the vicinity of the coupled antenna element, and the communication apparatus is notified of being positioned in the vicinity of this coupled antenna element.

In the antenna apparatus of the communication system according to still another aspect of the present technology, a coupled antenna element is excited by a wireless signal from the communication apparatus positioned in the vicinity of the coupled antenna element, and the communication apparatus positioned in the vicinity of this coupled antenna element is notified of being positioned in the vicinity of the coupled antenna element. In the communication apparatus of this communication system, the coupled antenna element positioned in the vicinity of this communication apparatus is detected on the basis of a notification from the notification unit of the antenna apparatus, adaptation of impedance is controlled on the basis of this detection result, the impedance is adapted on the basis of this control, and wireless communication is performed via an antenna element of the communication apparatus, or the antenna element of the communication apparatus and the coupled antenna element, the impedance of which has been adapted.

Effects of the Invention

According to the present technology, communication can be performed. Additionally, according to the present technology, a reduction in communication characteristics can be suppressed.

MODE FOR CARRYING OUT THE INVENTION

Modes for carrying out the present disclosure (hereinafter, referred to as embodiments) will be described below. Note that the description will be given in the following order.
1. First Embodiment (Position Notification System)
2. Second Embodiment (Anti-theft System)

1. First Embodiment

<Position Notification System>

Figure 1:
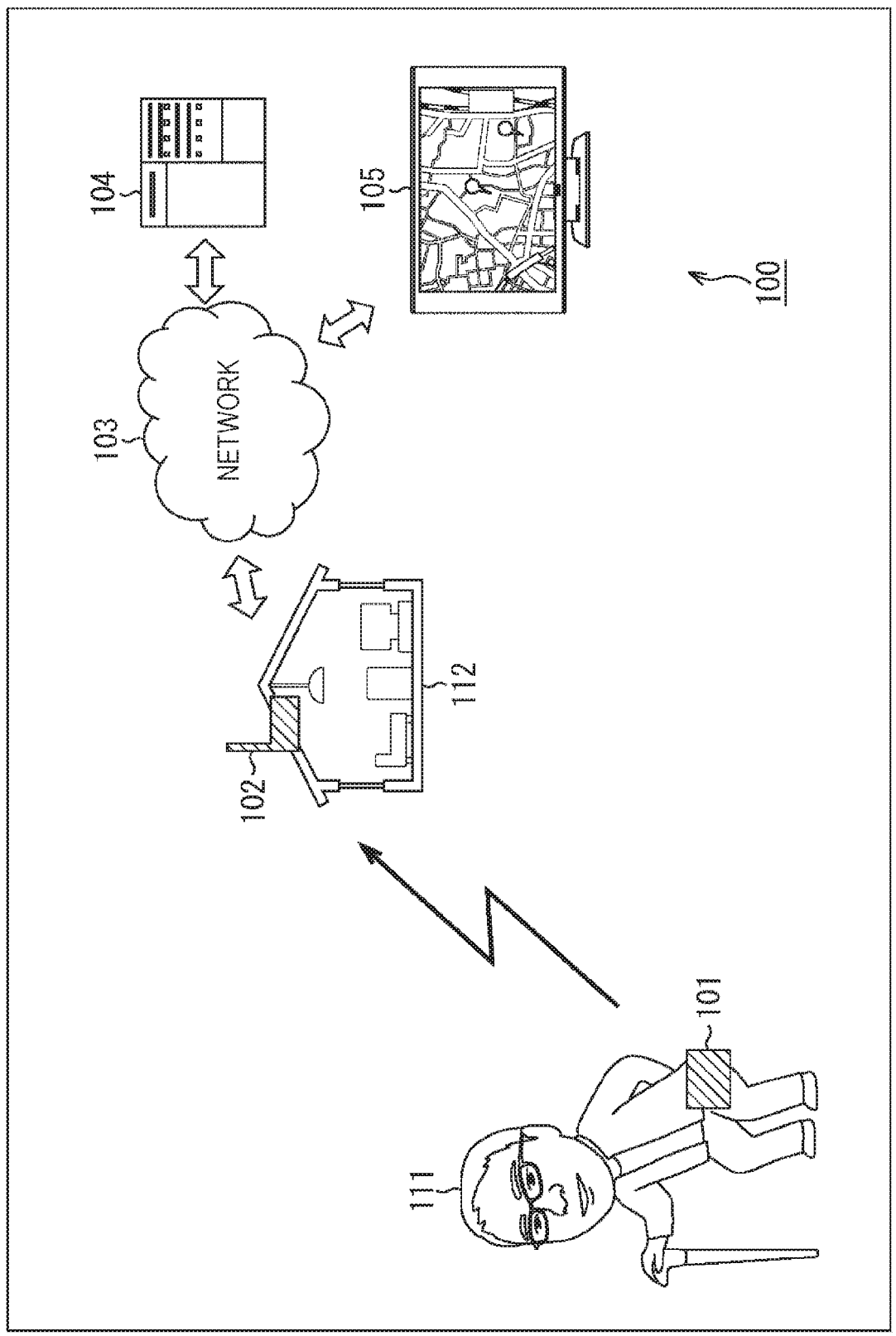
FIG. 1 is a diagram illustrating an exemplary main configuration of a position notification system.

FIG. 1 is a diagram illustrating an exemplary main configuration of a position notification system which is an embodiment of a signal transmission/reception system to which the present technology is applied. The position notification system 100 illustrated in FIG. 1 is a system in which a transmission apparatus 101 notifies its own position.

The transmission apparatus 101 transmits position information indicating its own position as a wireless signal. A high-sensitivity reception apparatus 102 receives this wireless signal to acquire the position information of the transmission apparatus 101 and supplies this position information to a server 104 via a network 103. In other words, the high-sensitivity reception apparatus 102 functions as a relay station that transfers the information transmitted from the transmission apparatus 101 to transfer to the server 104. The server 104 manages the position information of each transmission apparatus 101. A terminal apparatus 105 operated by a user who wishes to know the position of the transmission apparatus 101 accesses the server 104 via the network 103 to acquire the position information of the transmission apparatus 101 from the server 104 and, for example, displays the acquired position information together with map data or the like to notify the user of the position of the transmission apparatus 101.

For example, the transmission apparatus 101 is carried by a target person whose position the user wishes to grasp. In the example in FIG. 1, an elderly 111 carries the transmission apparatus 101. The transmission apparatus 101 can find its own position information (for example, latitude and longitude) as necessary by, for example, receiving a global navigation satellite system (GNSS) signal from a GNSS satellite. The transmission apparatus 101 transmits the position information thereon as a wireless signal as necessary. Accordingly, the user can grasp the position of the elderly 111 as a position monitoring target by operating the terminal apparatus 105 as described above.

Note that the target person of position monitoring is arbitrary. For example, the target may be a child or an animal such as a dog or a cat, or may be an employee of a company, or the like. The transmission apparatus 101 may be configured as a dedicated apparatus but, for example, may be built into a portable information processing apparatus such as a mobile phone or a smartphone.

The placement position of the high-sensitivity reception apparatus 102 is arbitrary. For example, the installation position may be a roof, a rooftop space, or the like of a structure 112 such as a building, a condominium, or a house. The structure 112 is suitable because there are a large number of structures in an urban area having a high possibility that a position monitoring target person (for example, the elderly 111) carrying the transmission apparatus 101 is likely to be active and additionally the placement therein is easy. In particular, the home of the position monitoring target person is suitable because the home is more likely to have the possibility that the position monitoring target person is positioned around the home. In addition, in terms of securing the placement location, it is easy and not troublesome to obtain consent in this case, as compared with a case where a provider of this position notification service secures a location to place the high-sensitivity reception apparatus 102 by its own efforts.

Furthermore, for example, in a case where the position monitoring target person (or the user) purchases or borrows the high-sensitivity reception apparatus 102 to place, the load (cost) of the position notification service provider can be further reduced than a case where the position notification service provider places the high-sensitivity reception apparatus 102 by its own efforts. In other words, with such an approach, it is possible to place more high-sensitivity reception apparatuses 102 at a lower cost.

While the transmission apparatus 101 is positioned within the communication coverage of any of the high-sensitivity reception apparatuses 102, the server 104 can manage the position of this transmission apparatus 101. In different words, if the position of the transmission apparatus 101 is out of the communication coverage of any high-sensitivity reception apparatus 102, the server 104 can no longer manage the position thereof. Accordingly, the server 104 can manage the position of the transmission apparatus 101 more accurately as the communication coverage network of the high-sensitivity reception apparatuses 102 for the transmission apparatus 101 is enlarged to a wider range. Here, more accurate management means managing the position of the transmission apparatus 101 in a wider range. In other words, in order to realize a wider range in which the position of the transmission apparatus 101 can be managed, it is more preferable that the transmission apparatus 101 and the high-sensitivity reception apparatus 102 be able to transmit and receive wireless signals farther away from each other (the communication coverage of each high-sensitivity reception apparatus 102 be wider). In addition, since the respective high-sensitivity reception apparatuses 102 are placed at mutually different positions, it is more preferable that a larger number of the high-sensitivity reception apparatuses 102 be employed. Furthermore, taking the usefulness into account, it is preferable to assign an area with a higher possibility that the transmission apparatus 101 is positioned as the communication coverage of the high-sensitivity reception apparatus 102.

Accordingly, as the number of the high-sensitivity reception apparatuses 102 increases, the quality of services that can be provided is enhanced, which is preferable for the position notification system 100. In other words, a more useful system can be implemented at a lower cost.

Note that, as for the placement location, in addition to the above examples, the high-sensitivity reception apparatus 102 may also be placed on a movable object (also referred to as a moving body) such as an automobile, a motorcycle, or a bicycle. In other words, the position of the high-sensitivity reception apparatus 102 may be variable.

The network 103 is an arbitrary communication network and may be a communication network for wired communication or a communication network for wireless communication, or may be constituted by both of the communication networks. In addition, the network 103 may be constituted by one communication network or may be constituted by a plurality of communication networks. Communication networks and communication paths conforming to any communication standards may be included in the network 103, examples of which are the Internet, a public telephone line network, a wide area communication network for a wireless moving body, such as a so-called 3G line or a 4G line, a wireless communication network for performing communication compliant with a wide area network (WAN), local area network (LAN), or Bluetooth (registered trademark) standard, a communication path for short-range wireless communication, such as the near field communication (NFC), a communication path for infrared communication, and a communication network for wired communication compliant with a standard such as the high-definition multimedia interface (HDMI) (registered trademark), the universal serial bus (USB), or the like.

The server 104 and the terminal apparatus 105 are information processing apparatuses that process information. The server 104 and the terminal apparatus 105 are communicably connected to the network 103 and can communicate with another communication apparatus connected to the network 103 via this network 103 to exchange information.

Figure 2:
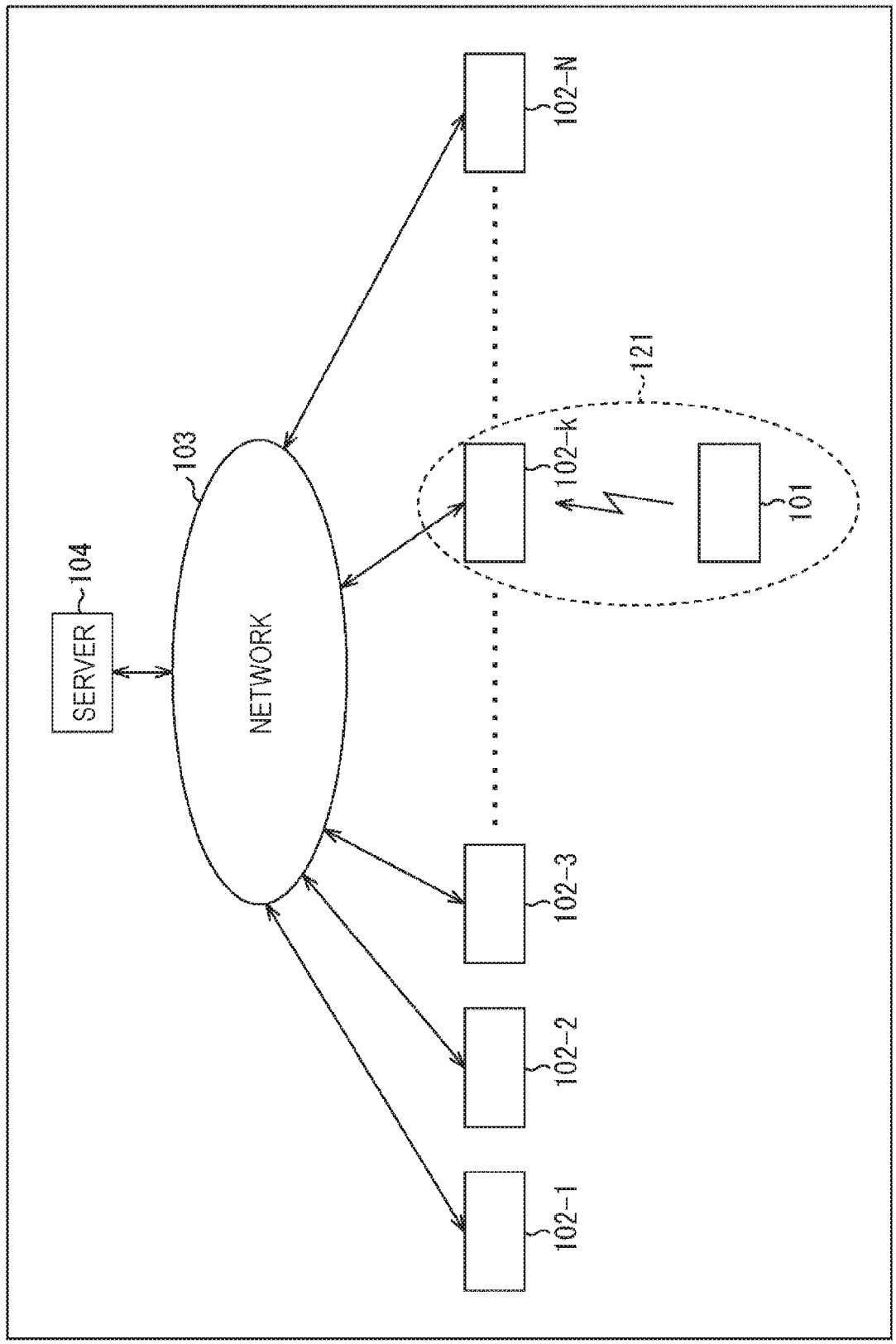
FIG. 2 is a diagram for explaining an example of how a position is notified.

In such a position notification system 100, the number of the transmission apparatuses 101, the high-sensitivity reception apparatuses 102, the servers 104, and the terminal apparatuses 105 is arbitrary and any member may be plural. For example, as illustrated in FIG. 2, it is assumed that the position notification system 100 has N (N is an arbitrary natural number) high-sensitivity reception apparatuses 102 placed at mutually different positions (a high-sensitivity reception apparatus 102-1 to a high-sensitivity reception apparatus 102-N).

The timing at which the transmission apparatus 101 transmits the wireless signal (position information) is arbitrary. For example, the transmission apparatus 101 may periodically transmit the wireless signal or may transmit the wireless signal at the occurrence of a predetermined event (for example, in a case where the transmission apparatus 101 moves by a predetermined distance or predetermined time has come).

In this case, the wireless signal transmitted from the transmission apparatus 101 is received by the high-sensitivity reception apparatus 102 positioned near the transmission apparatus 101. When the transmission apparatus 101 transmits a wireless signal from within a communication coverage 121 of the high-sensitivity reception apparatus 102-K (K is an integer of 1≤K≤N), the high-sensitivity reception apparatus 102-K receives this wireless signal to acquire the position information of the transmission apparatus 101 and supplies this position information to the server 104 via the network 103 (relays the position information).

For example, when the elderly 111 (transmission apparatus 101) moves to within the communication coverage of another high-sensitivity reception apparatus 102 and the transmission apparatus 101 transmits a wireless signal, the another high-sensitivity reception apparatus 102 similarly relays the position information. Accordingly, as long as the elderly 111 (the transmission apparatus 101) is positioned within the communication coverage of any of the high-sensitivity reception apparatuses 102, the user can grasp the position of the elderly 111.

The server 104 manages the position information of the transmission apparatus 101. In a case where there is a plurality of transmission apparatuses 101, the server 104 manages the position information thereon for each transmission apparatus 101. For example, the transmission apparatus 101 transmits its own identification information (ID) together with the position information. The server 104 stores this position information in association with the ID of the transmission apparatus 101 to manage. Accordingly, the server 104 can provide only the position information of the transmission apparatus 101 requested from the user (terminal apparatus 105). Note that the server 104 can also manage users for whom the provision of the position information is permitted, for each transmission apparatus 101. In other words, the server 104 can provide the position information of each transmission apparatus 101 only to a user who is permitted to acquire the position information of a specific transmission apparatus 101.

Note that the server 104 may manage the position information of the transmission apparatus 101 in association with another type of information other than the ID of the transmission apparatus 101. For example, the server 104 may store the position information of the transmission apparatus 101 in association with time information or the like to manage. By configuring in this manner, the server 104 can manage the history of the position information of the transmission apparatus 101 to provide.

Note that such time information may be transmitted from the transmission apparatus 101. For example, the transmission apparatus 101 may transmit the time information included in the GNSS signal as a wireless signal together with the position information.

In addition, the position information transmitted by the transmission apparatus 101 can be any information as long as the information can be managed in the server 104 as information indicating the position of the transmission apparatus 101 and its content is arbitrary. For example, the transmission apparatus 101 may transmit the GNSS signal (or the time information included in the GNSS signal) without finding the position information from the GNSS signal. In that case, the high-sensitivity reception apparatus 102 or the server 104 or the like may find the position information of the transmission apparatus 101 using the GNSS signal or the time information. In addition, an information processing apparatus (server or the like) for finding the position information of the transmission apparatus 101 using such a GNSS signal or time information may be separately provided.

Alternatively, for example, the position of the transmission apparatus 101 may be found on the basis of the placement position of the high-sensitivity reception apparatus 102 that receives the wireless signal from the transmission apparatus 101. For example, in the case of FIG. 2, the transmission apparatus 101 is positioned within the communication coverage 121 of the high-sensitivity reception apparatus 102. In such a case, the server 104 may estimate that the transmission apparatus 101 is positioned within the communication coverage 121 of the high-sensitivity reception apparatus 102-K as a result of relaying by the high-sensitivity reception apparatus 102-K and manage the fact to that effect as the position information. In other words, in this case, the position of the transmission apparatus 101 is managed with the granularity of the number of the high-sensitivity reception apparatuses 102 (the size of the communication coverage of each high-sensitivity reception apparatus 102). In this case, the transmission apparatus 101 is only required to transmit at least its own ID as a wireless signal.

In addition, for example, a distance between the high-sensitivity reception apparatus 102 and the transmission apparatus 101 may be estimated from the radio wave strength of the wireless signal received by the high-sensitivity reception apparatus 102, or the like, such that the server 104 also manages this distance as the position information. In other words, the server 104 may manage which high-sensitivity reception apparatus 102 has the communication coverage within which the transmission apparatus 101 is positioned and what distance is there between these high-sensitivity reception apparatus 102 and transmission apparatus 101. This estimation of distance may be made in the high-sensitivity reception apparatus 102 or the server 104, or may be made by a dedicated information processing apparatus (a server or the like) provided separately.

Furthermore, for example, in a case where the transmission apparatus 101 is positioned at a portion where the communication coverages of a plurality of high-sensitivity reception apparatuses 102 overlap, that is, in a case where the wireless signal transmitted by the transmission apparatus 101 is relayed by a plurality of high-sensitivity reception apparatuses 102, the position of the transmission apparatus 101 may be estimated using trigonometry or the like. This estimation of position may be made, for example, in the server 104 or may be made by a dedicated information processing apparatus (a server or the like) provided separately.

Each of the high-sensitivity reception apparatuses 102 may be enabled to relay information regarding an arbitrary transmission apparatus 101 or may be enabled to relay only information regarding the transmission apparatus 101 corresponding to the relevant high-sensitivity reception apparatus 102. For example, only the high-sensitivity reception apparatus 102 owned or managed by an owner (or a manager) of a certain transmission apparatus 101 may be enabled to relay information transmitted from the certain transmission apparatus 101. This owner (or the manager) may include not only individuals but also businesses. By configuring in this manner, it is possible to avoid sharing the high-sensitivity reception apparatus 102 by a plurality of users, such that a reduction in communication security, such as information leakage, for example, can be suppressed. In addition, the number of usable high-sensitivity reception apparatuses 102 may be set according to the amount of fee paid by the user. This makes it possible to achieve the differentiation of quality of services to be provided depending on considerations.

<Use Forms of Transmission Apparatus>

Figure 3:
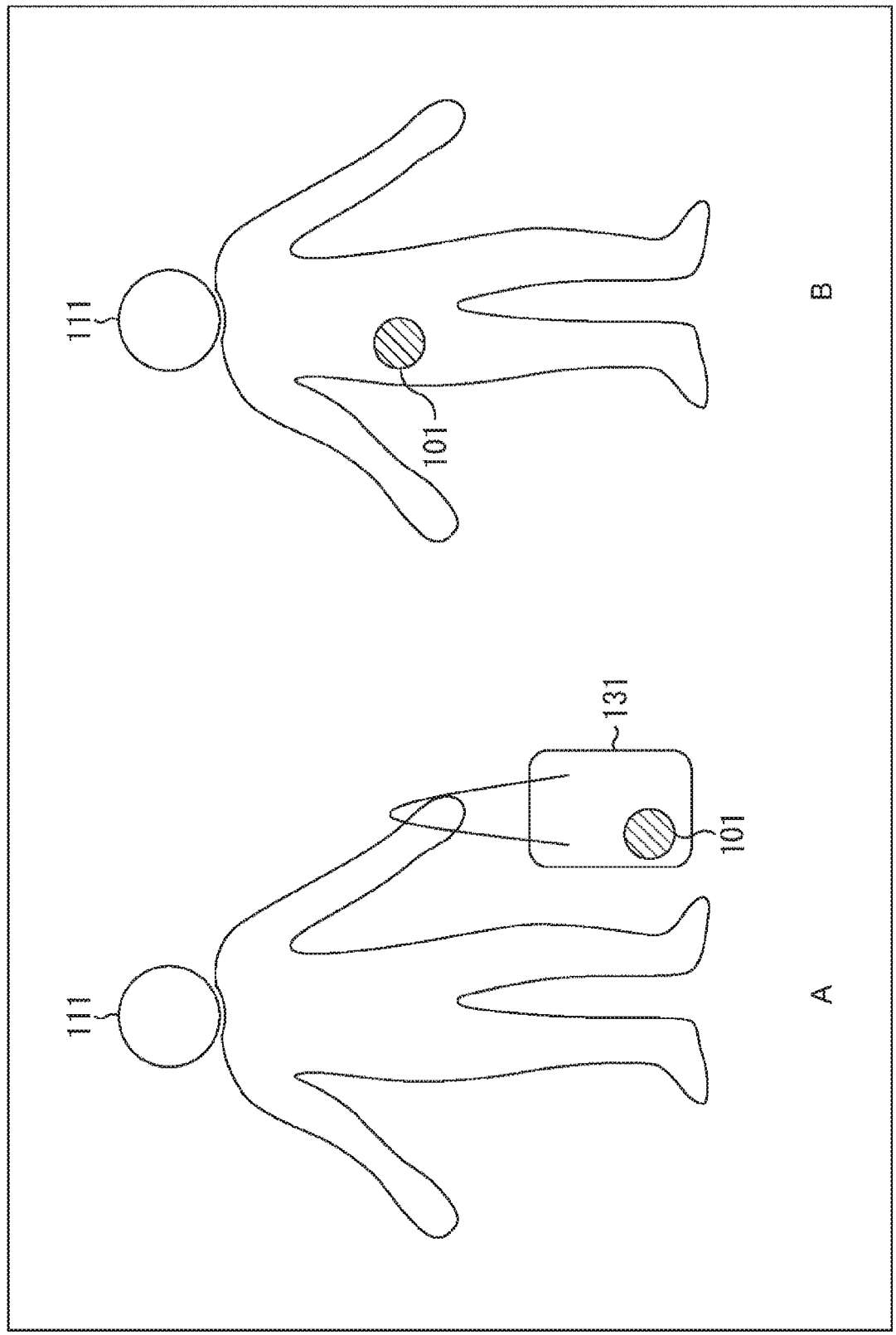
FIG. 3 is a diagram illustrating an example of use forms of a transmission apparatus.

In the position notification system 100 as described above, the elderly 111 puts the transmission apparatus 101 in a bag 131 to carry, as illustrated in A of FIG. 3 as an example. In this case, the transmission apparatus 101 is apart from the human body of the elderly 111 and the radiation characteristics of the wireless signal are not easily affected by the human body.

However, this transmission apparatus 101 is so compact that, as illustrated in B of FIG. 3 as an example, the elderly 111 also can put the transmission apparatus 101 in a pocket to carry. In such a case, since the transmission apparatus 101 is positioned in the vicinity of the human body, the radiation characteristics of the wireless signal are greatly affected by the human body to fluctuate. Therefore, there has been a fear that the communication characteristics of the transmission apparatus 101 are reduced.

<Jacket Type Communication System>

Thus, in order to improve the radiation characteristics of the wireless signal and suppress a reduction in communication characteristics even in the vicinity of the human body, an auxiliary antenna is brought in proximity to the transmission apparatus 101.

Figure 4:
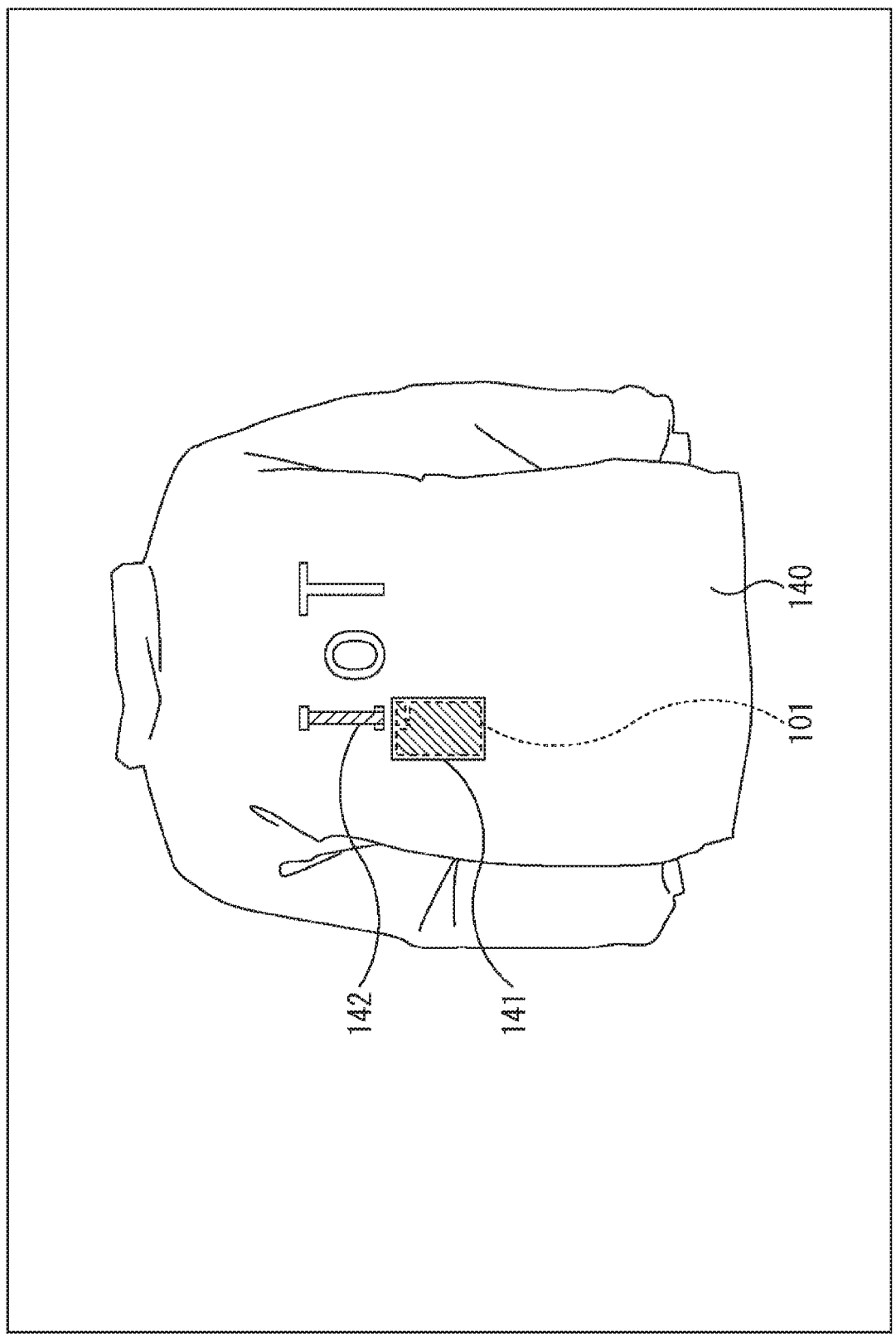
FIG. 4 is a diagram illustrating an exemplary main configuration of a jacket.

For example, a jacket 140 in FIG. 4 has a pocket 141 in which the transmission apparatus 101 can be retained and an antenna apparatus 142 provided at a position in the vicinity of the transmission apparatus 101 put in that pocket 141 to function as the auxiliary antenna as mentioned above. This transmission apparatus 101 put in the pocket 141 transmits a wireless signal using the antenna apparatus 142. In other words, the jacket 140 has a communication system constituted by the transmission apparatus 101 put in the pocket 141 and the antenna apparatus 142 to transmit a wireless signal.

Note that the antenna apparatus 142 may be formed so as to be a part of a picture (logo, message, letter, symbol, and the like) depicted on the jacket 140 as in the example in FIG. 4 such that the visual recognition of the antenna apparatus 142 is suppressed (in other words, the antenna apparatus 142 is inconspicuous). In the case of the example in FIG. 4, the antenna apparatus 142 is attached to a vertical line portion of "I" of the character string "IoT" depicted on a back portion of the jacket 140 (a portion with upper left to lower right shading in FIG. 4). Then, the pocket 141 is provided on the jacket 140 at such a location that the transmission apparatus 101 (an antenna 151 described later) in an accommodated state within that pocket 141 of the jacket 140 is positioned in the vicinity of an end portion of the above antenna apparatus 142 (a coupled antenna element 161 described later) (for example, below the letter "I").

In addition, this antenna apparatus 142 may be formed on a front side of the jacket 140 (that is, so as to be exposed) or a rear side of the jacket 140, or may be formed between a plurality of stacked fabrics (for example, between an outer material and a lining material)

Furthermore, the pocket 141 and the antenna apparatus 142 may be formed at an arbitrary position on the jacket 140 as long as the positional relationship between the pocket 141 and the antenna apparatus 142 is as described above.

<Transmission Apparatus>

Figure 5:
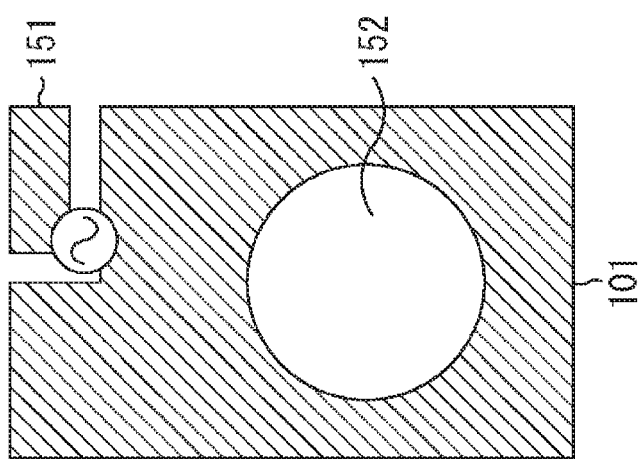
FIG. 5 is a diagram illustrating an exemplary main configuration of the transmission apparatus.

FIG. 5 is a diagram illustrating an exemplary main configuration of the transmission apparatus 101. As illustrated in FIG. 5, the transmission apparatus 101 has the compact antenna element 151 on an end portion thereof. For example, in a case where the transmission apparatus 101 transmits a wireless signal alone, the antenna element 151 functions as a radiating element that transmits a wireless signal. Meanwhile, for example, in a case where the transmission apparatus 101 transmits a wireless signal using the antenna apparatus 142, the antenna element 151 functions as an exciter that excites the antenna apparatus 142 functioning as an auxiliary antenna.

The transmission apparatus 101 may be enabled to transmit a wireless signal compliant with any communication standard. For example, the transmission apparatus 101 may transmit a wireless signal by a method capable of long-distance communication using a frequency zone including 925 MHz (also referred to as 920-MHz zone). This 920-MHz zone (for example, a frequency band of 920 MHz to 930 MHz) is a frequency zone released from July 2011 by the Ministry of Internal Affairs and Communications and can be used by anyone without a license. However, the maximum continuous transmission time is restricted to four seconds by the provision (Association of Radio Industries and Businesses (ARIB) STD T-108). If the continuous transmission time is further shortened to, for example, 0.2 seconds, more channels can be allocated and it is possible to perform transmission and reception with less interference.

Thus, in a case where the transmission apparatus 101 uses such a 920-Mhz zone, one transmission of data may be performed in units of a super frame of a predetermined time. The length of this predetermined time is arbitrary. For example, 30 seconds or five minutes may be adopted. A frame of 0.192 seconds is repeated up to 100 times at the maximum within this predetermined time. That is, since the continuous transmission time is less than 0.2 seconds, many transmission channels can be allocated to this transmission. As a result, relatively free channels can be selected for transmission and a more robust system against interference can be constructed.

In addition, a gap x between frames is at least a time of at least 2 ms or more. In the case of using the 920-MHz zone in Japan, carrier sense must be performed to confirm whether communication is being performed in a specific band before signal transmission. Then, only in a case where the band is free, the signal can be transmitted. Accordingly, 920 MHz cannot be used at any time. Consequently, the gap x may be different each time depending on the result of carrier sense (that is, how crowded the channel is). When 30 seconds are averaged, frames are configured to be transmitted at a rate of once every about 0.3 seconds. As a result, 100 frames are transmitted within the predetermined time of the super frame. The number of frames that can be transmitted somewhat fluctuates depending on the degree of congestion of the channel. Although the signal transmitted in 100 frames is arbitrary, when the same frame is repeatedly transmitted, the signal-to-noise (S/N) ratio can be enhanced by integrating the same frame in the high-sensitivity reception apparatus 102, whereby reception with higher sensitivity is enabled. In other words, communication of a longer distance becomes possible.

In addition, the transmission apparatus 101 has a magnetic material 152. This magnetic material 152 is used to fix the transmission apparatus 101 in the vicinity of the antenna apparatus 142. This magnetic material 152 may be provided inside a cabinet of the transmission apparatus 101, or may be partially or entirely exposed. By providing the magnetic body 152 inside the cabinet of the transmission apparatus 101, the occurrence of aged deterioration, damage, and the like can be suppressed.

<Antenna Apparatus>

Figure 6:
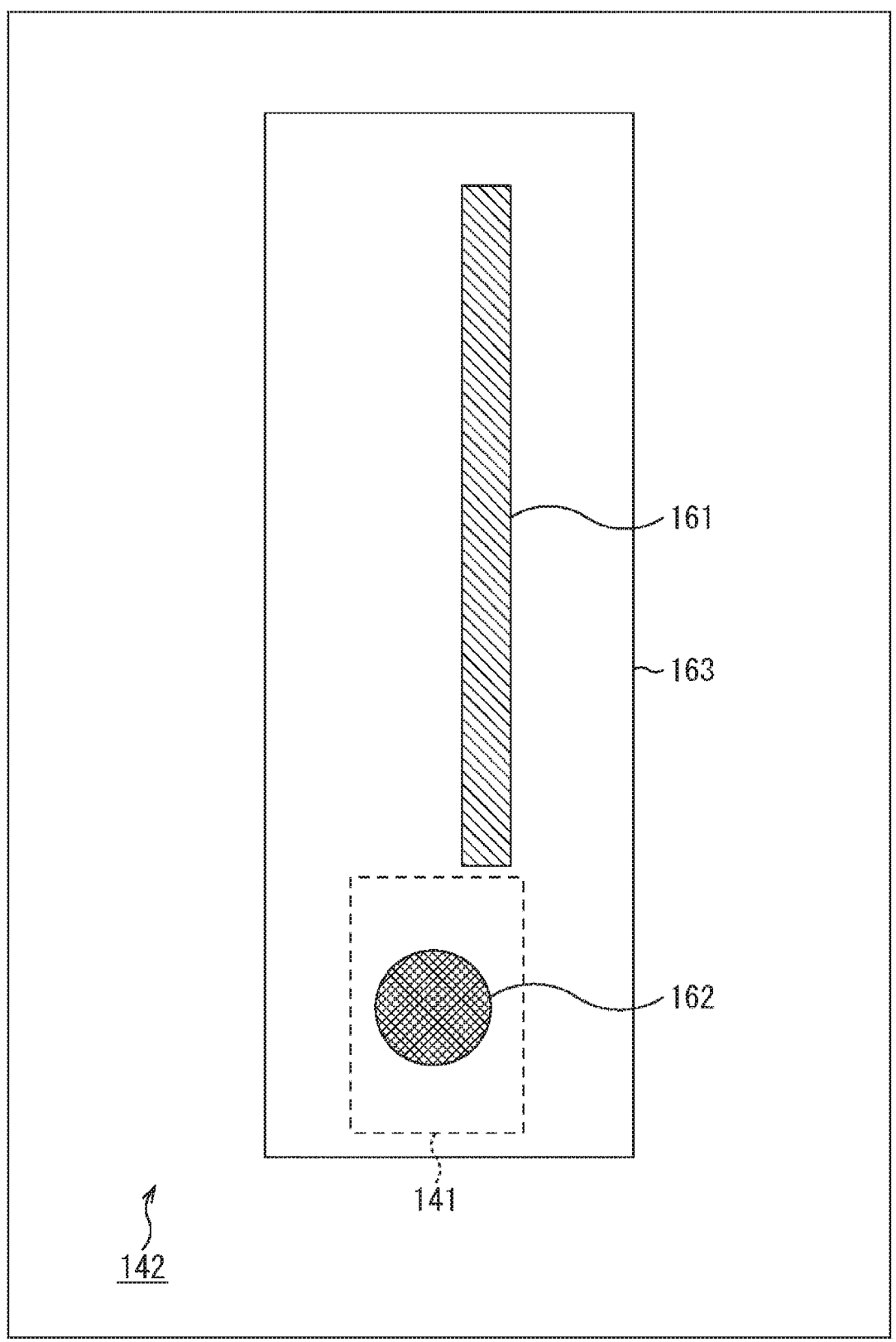
FIG. 6 is a diagram illustrating an exemplary main configuration of an antenna apparatus.

FIG. 6 is a diagram illustrating an exemplary main configuration of the antenna apparatus 142. As illustrated in FIG. 6, the antenna apparatus 142 has the coupled antenna element 161 and a magnet 162.

The coupled antenna element 161 is a parasitic antenna element which functions as an auxiliary antenna of the transmission apparatus 101. The coupled antenna element 161 is provided on the jacket 140 at such a position that an end portion of the coupled antenna element 161 is in the vicinity of the transmission apparatus 101 retained in the pocket 141. Note that, in the present description, the term "vicinity" includes both a state of contact (touch position) and a state of non-contact (slightly-apart position). In other words, the coupled antenna element 161 may be in contact with the transmission apparatus 101 (the antenna element 151 thereof) or may be in non-contact therewith. By laying out the coupled antenna element 161 in non-contact therewith, it is possible to suppress the occurrence of aged deterioration, damage, and the like in the coupled antenna element 161 and the transmission apparatus 101.

The coupled antenna element 161 is excited by the antenna element 151 of the transmission apparatus 101. This coupled antenna element 161 is formed in such a manner that the electrical length thereof in a longitudinal direction is longer than the electrical length of the antenna element 151 of the transmission apparatus 101 in a longitudinal direction. For example, the electrical length of the coupled antenna element 161 in the longitudinal direction may be approximately a half wavelength of the wireless signal transmitted by the transmission apparatus 101. By configuring in this manner, it is possible to increase the output of the wireless signal to be transmitted and to suppress a reduction in communication characteristics.

The coupled antenna element 161 is formed using a conductor such as metal, for example. The material and shape of the coupled antenna element 161 are arbitrary as long as the material and shape function as an antenna element. The coupled antenna element 161 may be constituted by a plurality of members. For example, the coupled antenna element 161 may be a conductive fiber (conductive yarn) or may be obtained by weaving conductive fibers (conductive yarns) into a net shape. In addition, the coupled antenna element 161 may be constituted by a plurality of types of materials. Note that electric power may be supplied to the coupled antenna element 161.

Figure 7:
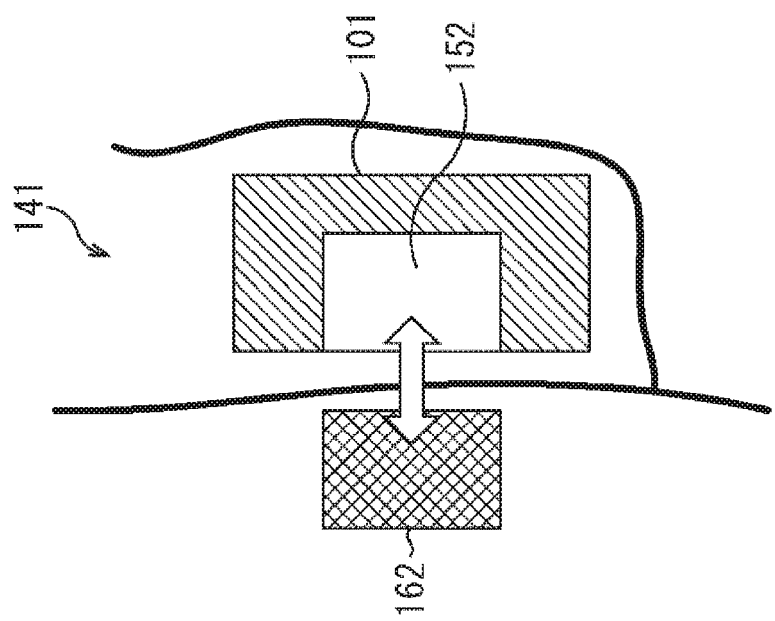
FIG. 7 is a diagram for explaining an example of how a position is fixed.

The magnet 162 is provided on the antenna apparatus 142 at a portion positioned at the pocket 141. The magnet 162 is used to fix the position of the transmission apparatus 101 retained in the pocket 141, as illustrated in FIG. 7 as an example. In other words, the magnet 162 of the antenna apparatus 142 and the magnetic material 152 of the transmission apparatus 101 attract each other, whereby the position of the transmission apparatus 101 is fixed at a predetermined position within the pocket 141 (in the vicinity of the antenna apparatus 142).

Figure 8:
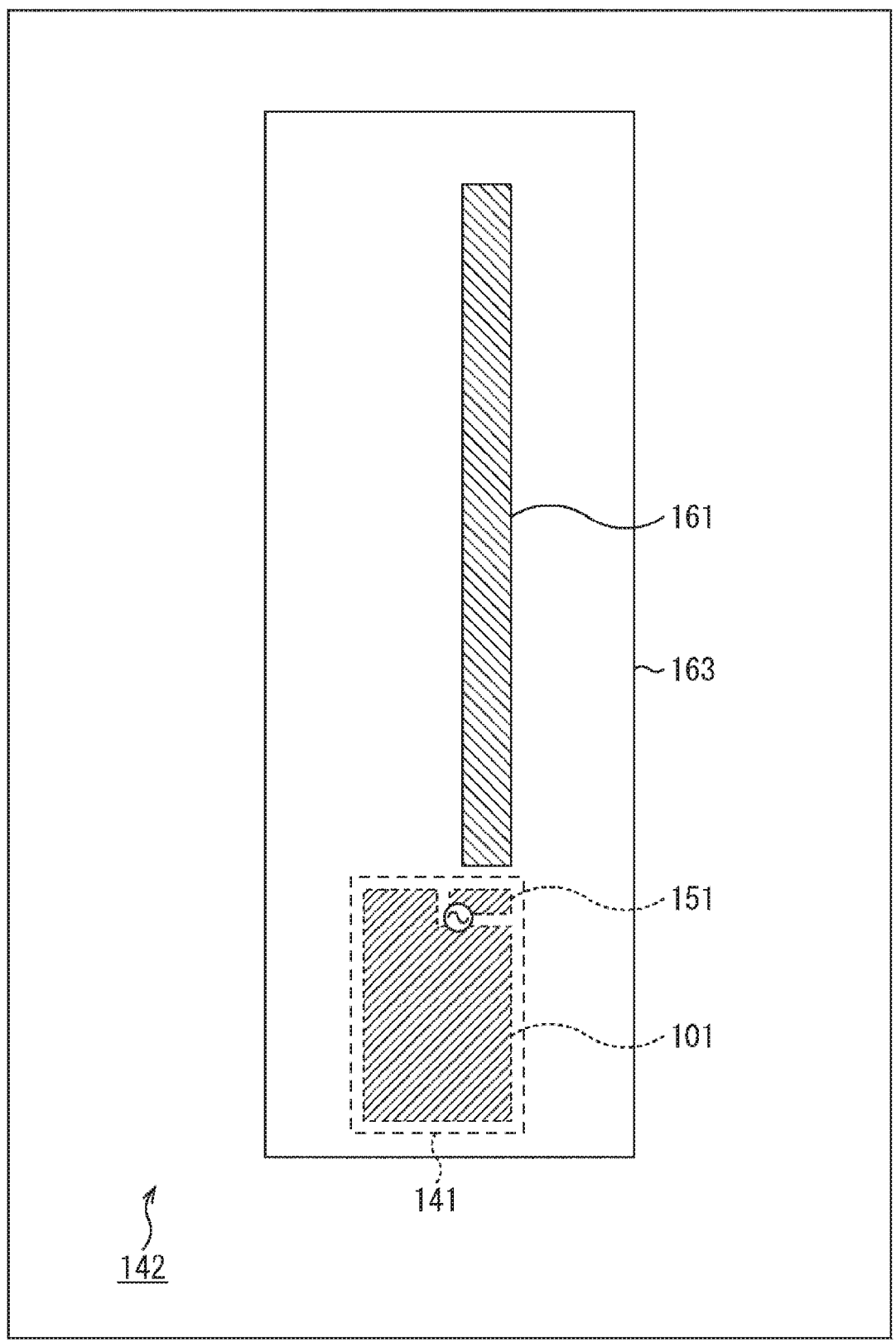
FIG. 8 is a diagram illustrating an example of how the transmission apparatus and the antenna apparatus are brought in proximity to each other.
Figure 9:
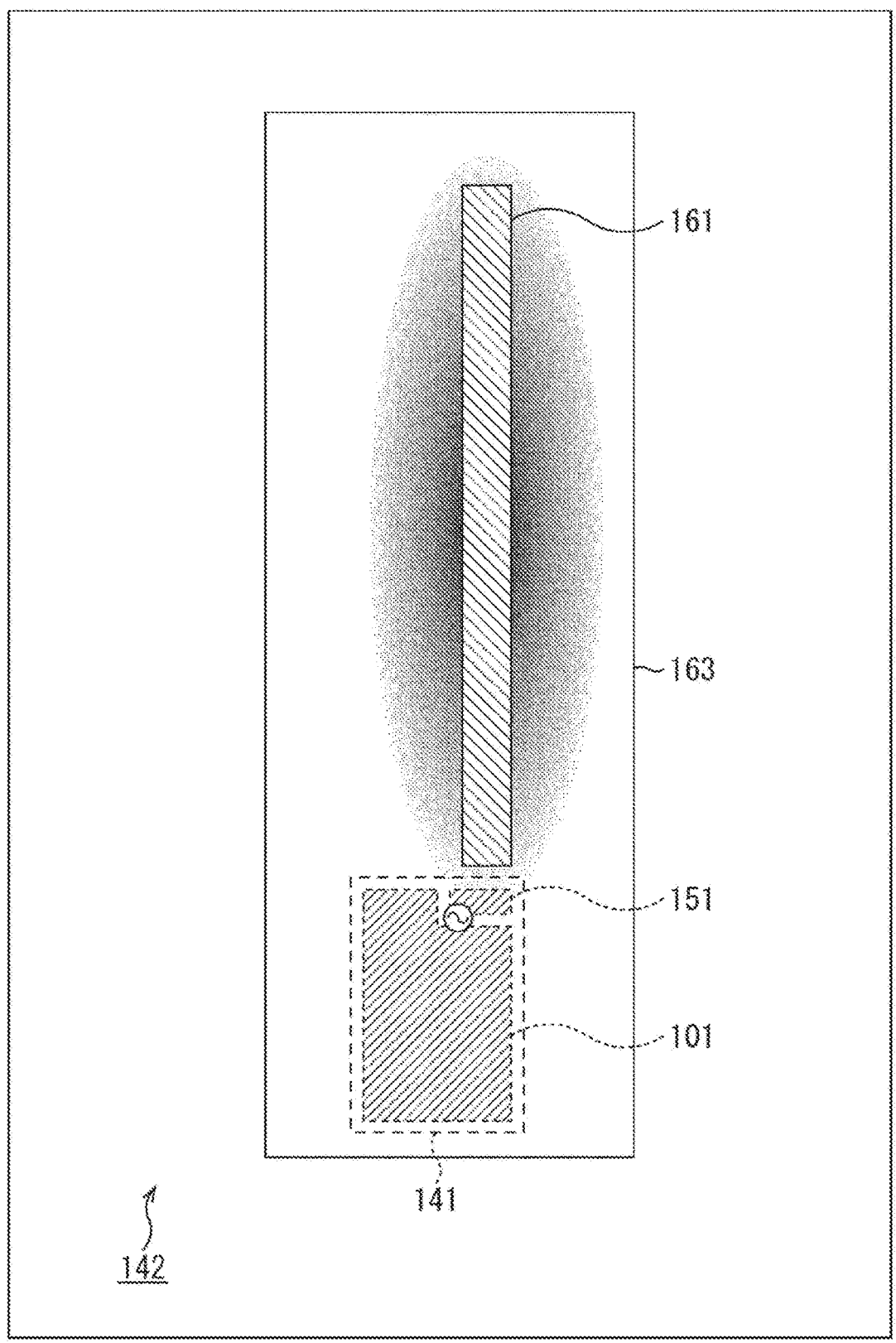
FIG. 9 is a diagram illustrating an example of radiation characteristics.

FIG. 8 is a diagram illustrating an example of how this state is brought about. In the case of this example, the transmission apparatus 101 is fixed inside the pocket 141 such that the antenna element 151 thereof is positioned in the vicinity of the end portion of the coupled antenna element 161. This allows the antenna element 151 to excite the coupled antenna element 161. Then, as illustrated in FIG. 9, excellent radiation characteristics can be obtained in the coupled antenna element 161 by such excitation. This makes it possible to suppress a reduction in communication characteristics of the transmission apparatus 101.

When the position is fixed as described above, the magnet 162 may be brought into contact with the transmission apparatus 101, or may be in non-contact therewith as in the example in FIG. 8. By fixing the position in non-contact, the occurrence of aged deterioration, damage, and the like can be suppressed.

Returning to FIG. 6, a reflection plate 163 may be further formed between the transmission apparatus 101 and the coupled antenna element 161, and the human body to cover the transmission apparatus 101 and the coupled antenna element 161 from the human body. By configuring in this manner, it is possible to suppress the influence of the human body on the wireless communication by the transmission apparatus 101 and the coupled antenna element 161. The reflection plate 163 may be formed using a conductor (electrical conductor) such as metal, for example. The material and shape of the reflection plate 163 are arbitrary. For example, the reflection plate 163 may be constituted by a plurality of members. For example, the reflection plate 163 may be obtained by weaving conductive fibers (conductive yarns) into a net shape. In addition, the reflection plate 163 may be constituted by a plurality of materials.

As described thus far, when used by being attached to the jacket 140 (accommodated in the pocket 141), the transmission apparatus 101 can transmit a signal using the antenna apparatus 142 (the coupled antenna element 161) brought in proximity thereto, such that it is possible to suppress a reduction in communication characteristics even in the vicinity of the human body. In different words, the jacket 140 to which the transmission apparatus 101 is attached (with the pocket 141 in which the transmission apparatus 101 is accommodated) has a communication system in which the transmission apparatus 101 transmits a signal using the antenna apparatus 142 arranged in the vicinity thereof. That is, the jacket 140 can suppress the influence of the human body to suppress a reduction in communication characteristics.

In addition, as in the example in FIG. 3, the transmission apparatus 101 can drive (transmit a signal) as the transmission apparatus 101 alone, or, as described with reference to FIGS. 4 to 9, the transmission apparatus 101 also can drive (transmit a signal) in combination with the antenna apparatus 142. Accordingly, in both cases where the transmission apparatus 101 is used in the vicinity of the human body and used at a position that is not in the vicinity of the human body, the transmission apparatus 101 can suppress the influence of the human body to suppress a reduction in communication characteristics. In other words, the transmission apparatus 101 can suppress a reduction in communication characteristics under more diverse environments.

Other Working Examples

Figure 10:
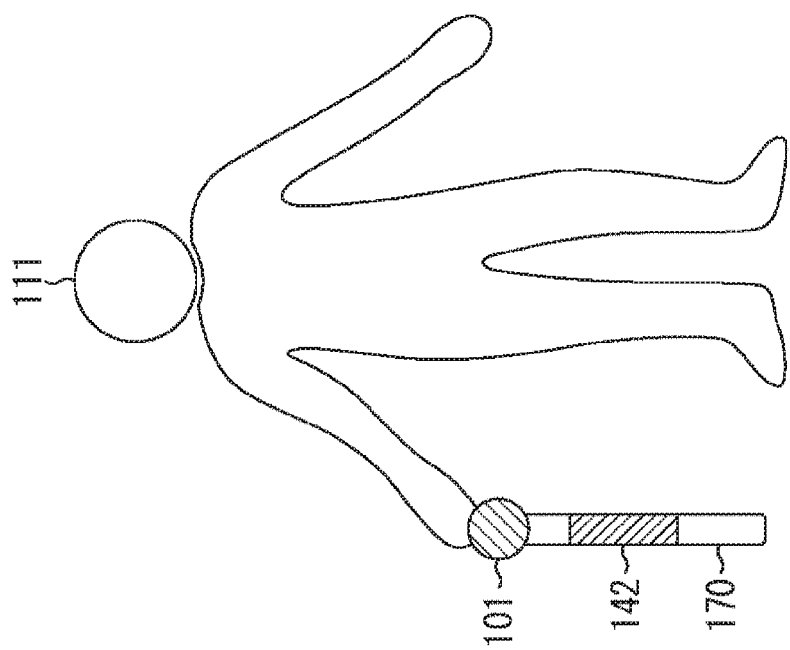
FIG. 10 is a diagram illustrating an example of a stick.

While the above description has explained that a communication system including the transmission apparatus 101 and the antenna apparatus 142 is implemented as the jacket 140, a device that implements such a communication system may be of any type. For example, as illustrated in FIG. 10, the communication system may be implemented as a stick 170. For example, the transmission apparatus 101 may be allowed to be attached to a grip of the stick 170 held by the elderly 111 such that the antenna apparatus 142 is formed in a portion of a shaft in the vicinity of this grip. Besides, for example, it becomes easier to observe the position of the elderly 111 by implementing the above-described communication system as a device which is easy for the elderly 111 (a target whose position is to be observed) to carry, such as a bag or a hat.

<Configuration of Each Device>

Figure 11:
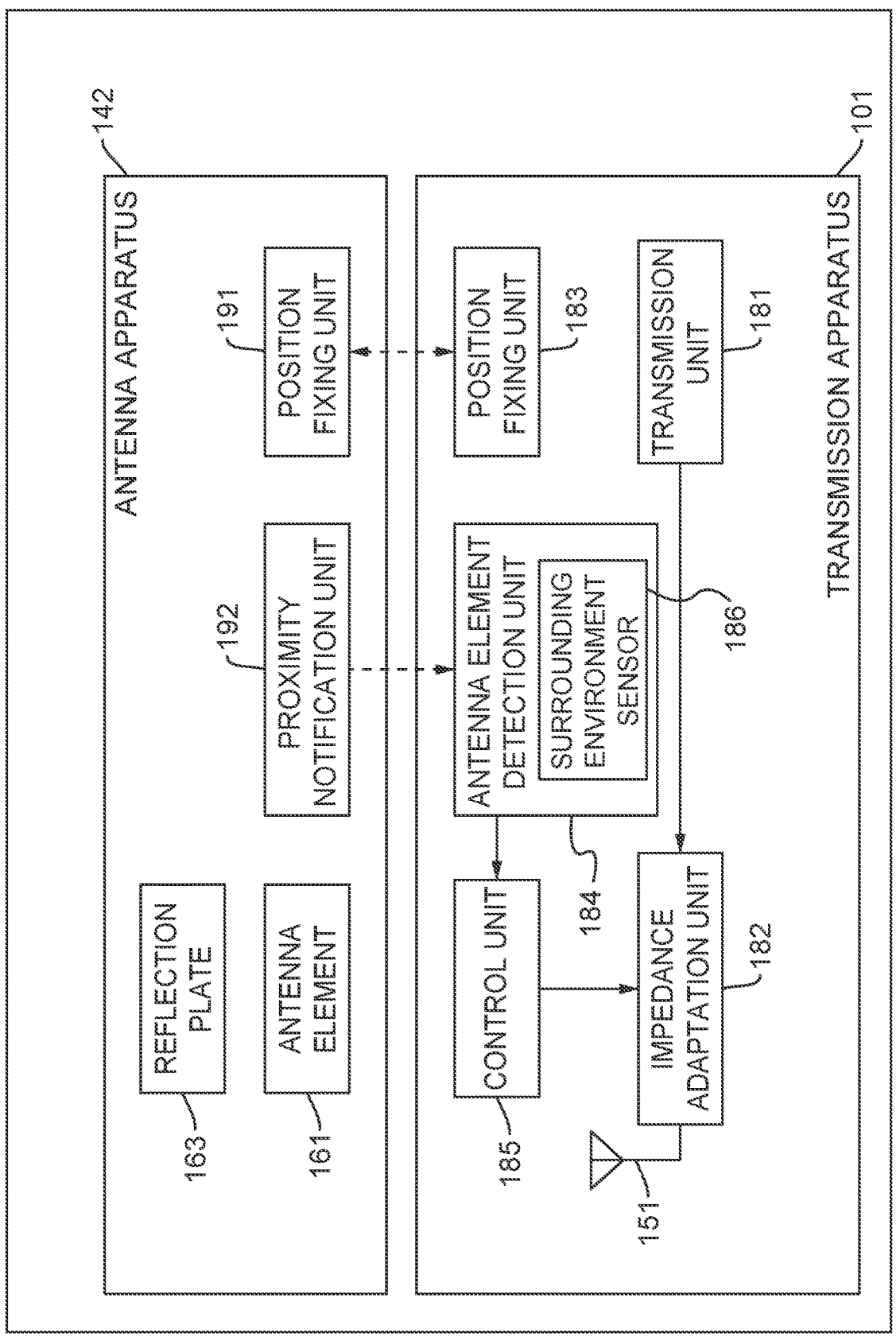
FIG. 11 is a block diagram illustrating an exemplary main configuration of the transmission apparatus.

FIG. 11 is a block diagram illustrating an exemplary main configuration inside the transmission apparatus 101 and the antenna apparatus 142. As illustrated in FIG. 11, the transmission apparatus 101 has a transmission unit 181, an impedance adaptation unit 182, a position fixing unit 183, an antenna element detection unit 184, and a control unit 185. Meanwhile, the antenna apparatus 142 has a position fixing unit 191 and a proximity notification unit 192 in addition to the above-described coupled antenna element 161 and reflection plate 163.

The transmission unit 181 performs a process relating to the transmission of a wireless signal. For example, the transmission unit 181 generates a transmission signal to supply to the antenna element 151 via the impedance adaptation unit 182 and causes the generated transmission signal to radiate from this antenna element 151 (that is, causes this antenna element 151 to transmit the generated transmission signal as a wireless signal). Note that the contents and specifications of this transmission signal are arbitrary. For example, the transmission unit 181 may receive the GNSS signal to find current position information of the transmission apparatus 101 using this GNSS signal and generate a transmission signal including this position information.

The impedance adaptation unit 182 performs impedance adaptation on the basis of the control of the control unit 185. For example, the impedance adaptation unit 182 aligns the impedance of the antenna element 151 with the impedance of the transmission unit 181. In addition, for example, the impedance adaptation unit 182 aligns the impedance of the antenna element 151 and the coupled antenna element 161 of the antenna apparatus 142 with the impedance of the transmission unit 181.

The position fixing unit 183 and the position fixing unit 191 function in cooperation with each other and fix each other to fix the relative position between the antenna apparatus 142 and the transmission apparatus 101. The position fixing unit 183 and the position fixing unit 191 may be constituted by any type. For example, in the case of FIG. 5, the position fixing unit 183 is formed by the magnetic material 152. In addition, for example, in the case of FIG. 6, the position fixing unit 191 is constituted by the magnet 162. In other words, in this case, the position fixing unit 183 and the position fixing unit 191 fix the relative position between the antenna apparatus 142 and the transmission apparatus 101 using magnetic force. Besides, for example, the position fixing unit 183 and the position fixing unit 191 may fix the relative position between the antenna apparatus 142 and the transmission apparatus 101 by physical shapes such as concave and convex shapes. For example, the position fixing unit 183 and the position fixing unit 191 may have physical shapes (concave and convex shapes) corresponding to each other and use these physical shapes to fix the relative position between the antenna apparatus 142 and the transmission apparatus 101 by fitting, screwing, or the like. In other words, the position fixing unit 183 may be configured as a part or the whole of the cabinet of the transmission apparatus 101, while the position fixing unit 191 may be configured as a part or the whole of a cabinet of the antenna apparatus 142.

Note that these position fixing unit 183 and position fixing unit 191 may be configured as separate bodies from the transmission apparatus 101 and the antenna apparatus 142. Additionally, the position fixing unit 183 and the position fixing unit 191 may be configured integrally. For example, the position fixing unit 183 and the position fixing unit 191 may be employed as cases or the like in which the cabinets of the transmission apparatus 101 and the antenna apparatus 142 are accommodated so as to fix their respective positions.

Note that the position fixing unit 183 and the position fixing unit 191 do not have to completely fix the relative position between the antenna apparatus 142 and the transmission apparatus 101. In practice, the relative position between the antenna apparatus 142 and the transmission apparatus 101 is only required to be stabilized to such an extent that the relative position can be regarded as "fixed". For example, the position fixing unit 183 and the position fixing unit 191 may be implemented as pockets, shelves, or the like that accommodate the transmission apparatus 101 and the antenna apparatus 142.

In addition, the position fixing unit 183, or the position fixing unit 191, or the both may be constituted by a plurality of members. In that case, the number of members of the position fixing unit 183 and the position fixing unit 191 may be the same as each other or different from each other.

Furthermore, the position fixing unit 183 and the position fixing unit 191 may fix (stabilize) the relative position between the antenna apparatus 142 and the transmission apparatus 101 by a plurality of methods. For example, as described above, the position fixing unit 183 and the position fixing unit 191 may be constituted by the pocket 141, and the magnetic material 152 and the magnet 162. Alternatively, for example, the position fixing unit 183 and the position fixing unit 191 may fix (stabilize) the relative position between the antenna apparatus 142 and the transmission apparatus 101 by physical shapes (fitting, screwing, or the like) and magnetic force.

The position fixing unit 183 and the position fixing unit 191 as described above can stabilize the relative position between the transmission apparatus 101 and the antenna apparatus 142 and can suppress the fluctuation of the radiation characteristics of the wireless signal due to a change in the relative position between the transmission apparatus 101 and the antenna apparatus 142, thereby being able to suppress a reduction in communication characteristics. Note that the position fixing unit 183 and the position fixing unit 191 may be omitted in a case where such fluctuation of the radiation characteristics of the wireless signal due to a change in the relative position between the transmission apparatus 101 and the antenna apparatus 142 is not taken into account.

The proximity notification unit 192 notifies the transmission apparatus 101 positioned in the vicinity of the antenna apparatus 142 (brought in proximity to the antenna apparatus 142) of the fact to that effect. For example, in the case of FIG. 6, the proximity notification unit 192 is constituted by the magnet 162. In other words, in this case, the magnet 162 uses the magnetic field to notify the transmission apparatus 101 that the transmission apparatus 101 has been brought in proximity to the antenna apparatus 142. Note that the magnet 162 can function also as the position fixing unit 191 as described above. In this manner, one device may serve as the position fixing unit 191 and the proximity notification unit 192 (these two functions may be implemented by one device).

The antenna element detection unit 184 detects the antenna apparatus 142 (coupled antenna element 161) brought in proximity. For example, the antenna element detection unit 184 may detect the antenna apparatus 142 (coupled antenna element 161) brought in proximity by receiving a notification from the proximity notification unit 192. For example, the antenna element detection unit 184 may have a surrounding environment sensor 186 that detects a change in an environment around the transmission apparatus 101, or the like such that this sensor detects a change in an environment around the transmission apparatus 101 arising from a notification from the proximity notification unit 192 to detect the antenna apparatus 142 located in the vicinity. For example, the antenna element detection unit 184 may have a magnetic sensor such as a Hall element such that a change in the magnetic field produced by the magnet 162 of the antenna apparatus 142 brought in proximity is detected by this magnetic sensor.

In addition, the antenna element detection unit 184 may have a switch, or a connector, or the both which cause an electrical change in a circuit inside the transmission apparatus 101 on the basis of a change in an environment around the transmission apparatus 101, or the like. For example, such a switch may detect the antenna apparatus 142 located in the vicinity by shifting the connection according to a change in an environment around the transmission apparatus 101 arising from a notification from the proximity notification unit 192. For example, the antenna element detection unit 184 may have a magnet switch or a magnetization switch (reed switch) such that these switches shift the connection according to a change in the magnetic field produced by the magnet 162 of the antenna apparatus 142 brought in proximity.

In other words, the proximity notification unit 192 may cause the environment around the transmission apparatus 101 to change with respect to some parameter such that the antenna element detection unit 184 detects such a change in the environment therearound (or shifts the connection of the circuit on the basis of a change in the environment), whereby a notification (that is, the fact that the antenna apparatus 142 is positioned in the vicinity of the transmission apparatus 101) is received from the proximity notification unit 192. A parameter used for exchanging such a notification is arbitrary and is not limited to the above examples of magnetism (magnetic field). For example, the parameter may be light, brightness, sound, capacitance (electric field), voltage, current, vibration, force, pressure, temperature, humidity, chemical substance, odor, or the like.

For example, the antenna element detection unit 184 may have a capacitive sensor such that this capacitive sensor detects a change in capacitance produced by the antenna apparatus 142 brought in proximity. In addition, for example, the antenna element detection unit 184 may have an ultrasonic sensor such that this ultrasonic sensor sends an ultrasonic wave and detects a change in a reflected wave thereof produced by the antenna apparatus 142 brought in proximity. Furthermore, for example, the antenna element detection unit 184 may have an infrared sensor such that this infrared sensor detects a change in infrared light produced by the antenna apparatus 142 brought in proximity. Meanwhile, for example, the antenna element detection unit 184 may have an image sensor that obtains a picked-up image therearound such that this image sensor detects a change in the picked-up image produced by the antenna apparatus 142 brought in proximity.

Note that the notification by the proximity notification unit 192 and the detection by the antenna element detection unit 184 may employ any methods as long as the methods correspond to each other. For example, the proximity notification unit 192 may output some energy such as light, audio, current, or vibration such that the antenna element detection unit 184 detects this energy. For example, a light emitting unit of the proximity notification unit 192 may emit infrared light, visible light, laser light, or the like such that a light receiving unit of the antenna element detection unit 184 receives this light. In addition, for example, a speaker of the proximity notification unit 192 may output audio such that a microphone of the antenna element detection unit 184 gathers this audio. Furthermore, for example, the proximity notification unit 192 may be shaped into a part or the whole of the cabinet of the antenna apparatus 142 (that is, the proximity notification unit 192 may be constituted by a physical shape) such that the antenna element detection unit 184 is employed as a mechanical switch to be pressed by this proximity notification unit 192 (the cabinet of the antenna apparatus 142). In that case, the configuration of the proximity notification unit 192 may also serve as the position fixing unit 191 such that, while the relative position between the transmission apparatus 101 and the antenna apparatus 142 is fixed by the position fixing unit 183 and the position fixing unit 191, the mechanical switch as the antenna element detection unit 184 is pressed by the proximity notification unit 192.

As a matter of course, the proximity notification unit 192 may make a notification by a plurality of methods such that the antenna element detection unit 184 detects this notification by a plurality of methods.

As described thus far, the antenna element detection unit 184 can grasp that the antenna apparatus 142 (coupled antenna element 161) has been brought in proximity. Then, by receiving a notification from the proximity notification unit 192, the antenna element detection unit 184 can more easily detect the antenna apparatus 142 (coupled antenna element 161) brought in proximity. In different words, the proximity notification unit 192 notifies the antenna element detection unit 184, thereby being able to allow the antenna element detection unit 184 to more easily grasp that the antenna apparatus 142 (coupled antenna element 161) has been brought in proximity.

The antenna element detection unit 184 notifies the control unit 185 of this detection result.

The control unit 185 controls adaptation of impedance by the impedance adaptation unit 182. For example, the control unit 185 may control adaptation of impedance by the impedance adaptation unit 182 on the basis of the detection result supplied from the antenna element detection unit 184.

As described earlier, the transmission apparatus 101 can be used alone and also can be used in combination with the antenna apparatus 142. In a case where the transmission apparatus 101 is used alone, the signal is transmitted via the antenna element 151. On the other hand, in a case where the transmission apparatus 101 is used in combination with the coupled antenna apparatus 142, the signal is transmitted via the antenna element 151 and the coupled antenna element 161. Additionally, as illustrated in FIG. 9 and the other drawings, the coupled antenna element 161 has a longer electrical length than that of the antenna element 151 and also has larger impedance than that of the antenna element 151. In other words, the impedance on the antenna side changes between a case where the transmission apparatus 101 is used alone and a case where the transmission apparatus 101 is used in combination with the antenna apparatus 142. Therefore, when the impedance on the antenna side at the time of impedance adaptation is assigned to a fixed value, misadaptation of impedance arises and there has been a fear that the communication characteristics are reduced.

Thus, the impedance on the antenna side for impedance adaptation is assigned as being variable.

<Impedance Adaptation Unit>

Figure 12:
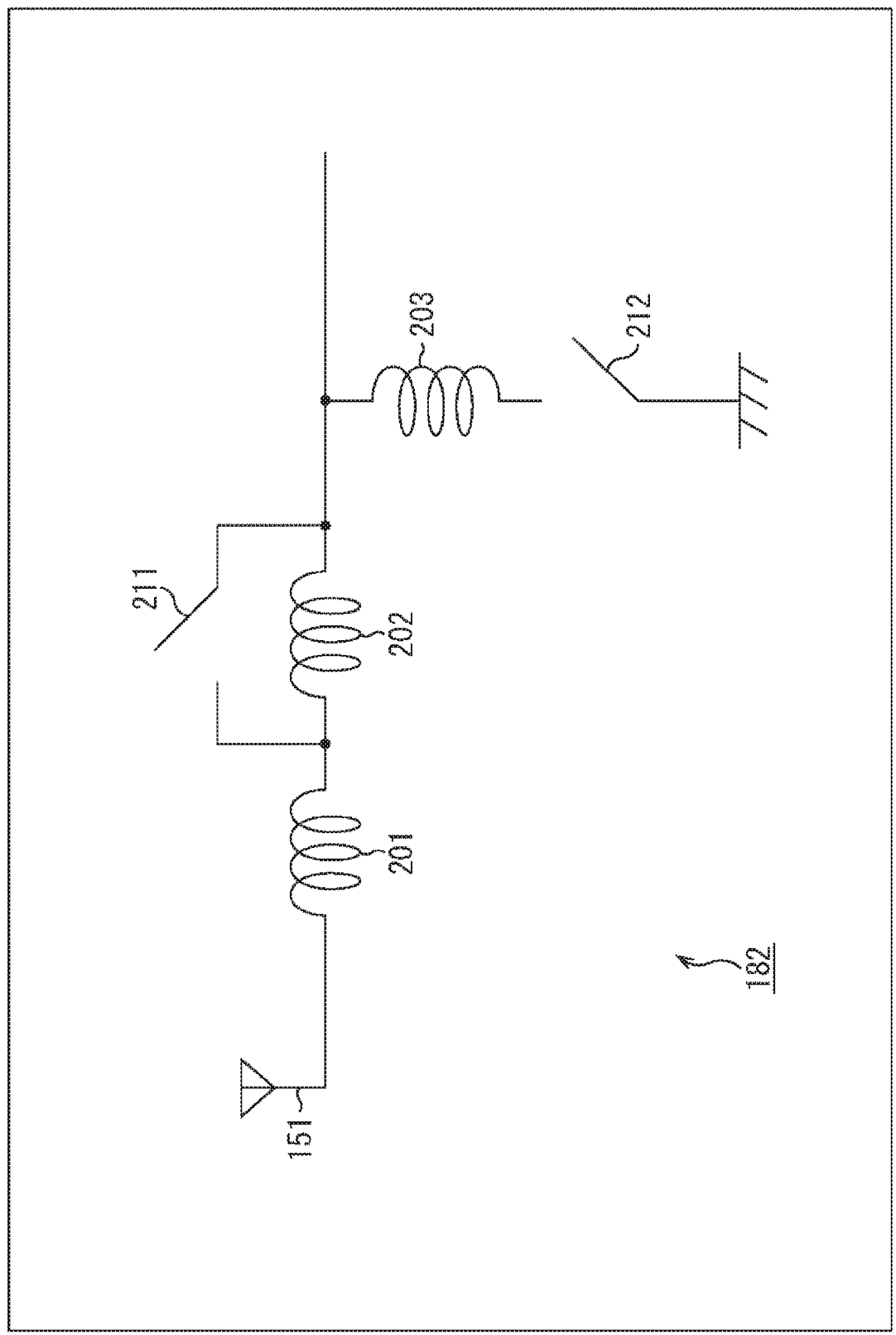
FIG. 12 is a diagram illustrating an exemplary main configuration of an impedance adaptation unit.

FIG. 12 illustrates an exemplary main configuration of the impedance adaptation unit 182. In this case, the impedance adaptation unit 182 has inductors 201 to 203 and switches 211 and 212. As illustrated in FIG. 12, the inductors 201 and 202 are arranged in series between the antenna element 151 and the transmission unit 181. In addition, the switch 211 is arranged in parallel with the inductor 202. Furthermore, the inductor 203 and the switch 212 are arranged in series between a wire connecting the transmission unit 181 and the inductor 202 and a ground (reference potential).

When the switch 211 is turned on, both ends of the inductor 202 are short-circuited. Meanwhile, when the switch 212 is turned on, a terminal of the inductor 203 on a side not connected to the inductor 202 is grounded. In other words, by driving (turning on and off) these switches 211 and 212, the impedance of the circuit inside the transmission apparatus 101 can be changed. Then, the values of the respective inductors are set to such values that can adapt the impedance of the antenna element 151 with the impedance of the transmission unit 181 or adapt the impedance of the antenna element 151 and the coupled antenna element 161 with the impedance of the transmission unit 181 by driving (turning on and off) these switches 211 and 212.

The driving (turning on and off) of these switches 211 and 212 is controlled by the control unit 185. In other words, the control unit 185 can drive (turn on and off) these switches 211 and 212 to adapt the impedance of the antenna element 151 with the impedance of the transmission unit 181 or adapt the impedance of the antenna element 151 and the coupled antenna element 161 with the impedance of the transmission unit 181.

Note that the configuration of the impedance adaptation unit 182 is not limited to the example in FIG. 12. For example, the impedance adaptation unit 182 may have a capacitor such that the impedance to be matched is shifted as described above by shifting the configuration of the capacitor. As a matter of course, the impedance adaptation unit 182 may have both of an inductor and a capacitor such that the impedance to be matched is shifted as described above by shifting the configurations of the inductor and the capacitor.

In addition, the configuration of the switch that shifts the circuit configuration of the impedance adaptation unit 182 is also arbitrary and is not limited to the example in FIG. 12. For example, the number and positions of such switches are arbitrary.

<Flow of Control Process>

Figure 13:
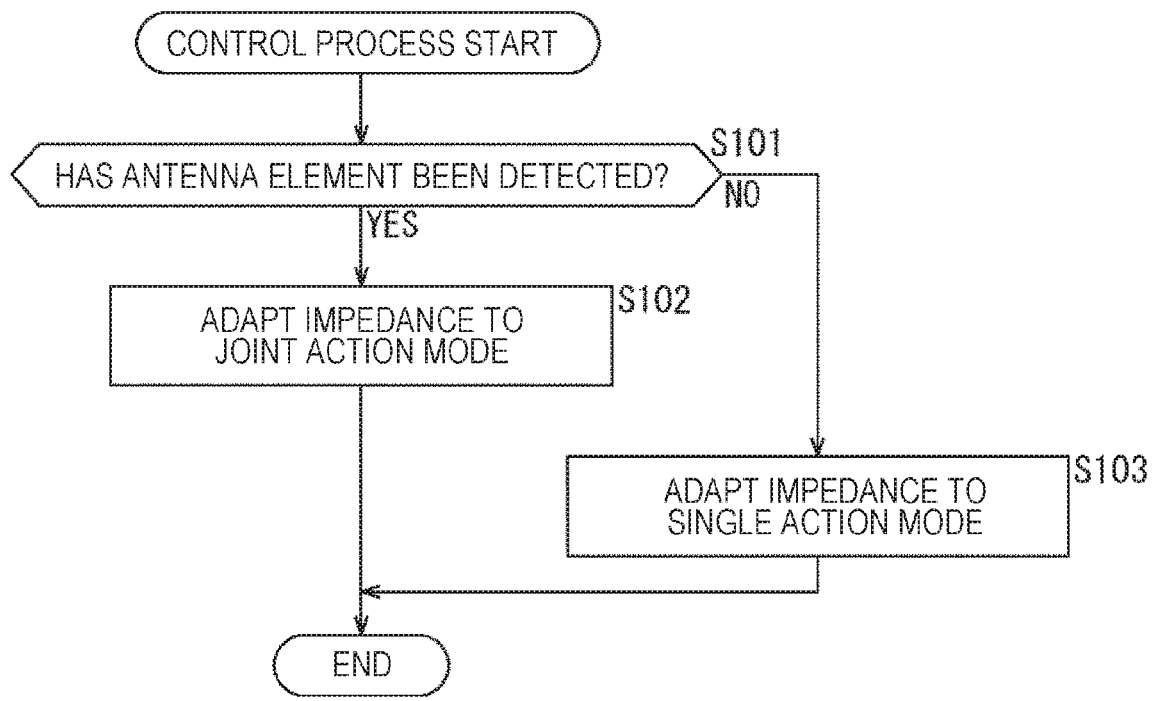
FIG. 13 is a diagram for explaining an example of a frequency band of a broadcast signal.

An exemplary flow of a control process executed to control such impedance adaptation will be described with reference to a flowchart in FIG. 13.

When the control process is started, the control unit 185 determines in step S101 whether the antenna apparatus 142 (coupled antenna element 161) has been detected on the basis of the detection result supplied from the antenna element detection unit 184. In a case where it is determined that the antenna apparatus 142 has been detected, the process proceeds to step S102.

In step S102, the control unit 185 controls the impedance adaptation unit 182 (the switches 211 and 212) to adapt the impedance to a joint action mode. The joint action mode is a mode in which the transmission apparatus 101 is used in combination with the antenna apparatus 142. In other words, in this joint action mode, the antenna element 151 of the transmission apparatus 101 excites the coupled antenna element 161 of the antenna apparatus 142 brought in proximity to the transmission apparatus 101, whereby the transmission apparatus 101 transmits the wireless signal via the coupled antenna element 161. Accordingly, in the case of this mode, the control unit 185 controls driving (turning on and off) of the switches 211 and 212 so as to match the impedance of the antenna element 151 and the coupled antenna element 161 with the impedance of the transmission unit 181. Once the process in step S102 is terminated, the control process is terminated.

Meanwhile, in a case where it is determined in step S101 that the antenna apparatus 142 has not been detected, the process proceeds to step S103.

In step S103, the control unit 185 controls the impedance adaptation unit 182 (the switches 211 and 212) to adapt the impedance to a single action mode. The single action mode is a mode in which the transmission apparatus 101 is used alone (the antenna apparatus 142 is not used). In other words, in this single action mode, the transmission apparatus 101 transmits the wireless signal from the antenna element 151 thereof. Accordingly, in the case of this mode, the control unit 185 controls driving (turning on and off) of the switches 211 and 212 so as to match the impedance of the antenna element 151 with the impedance of the transmission unit 181. Once the process in step S103 is terminated, the control process is terminated.

Figure 14:
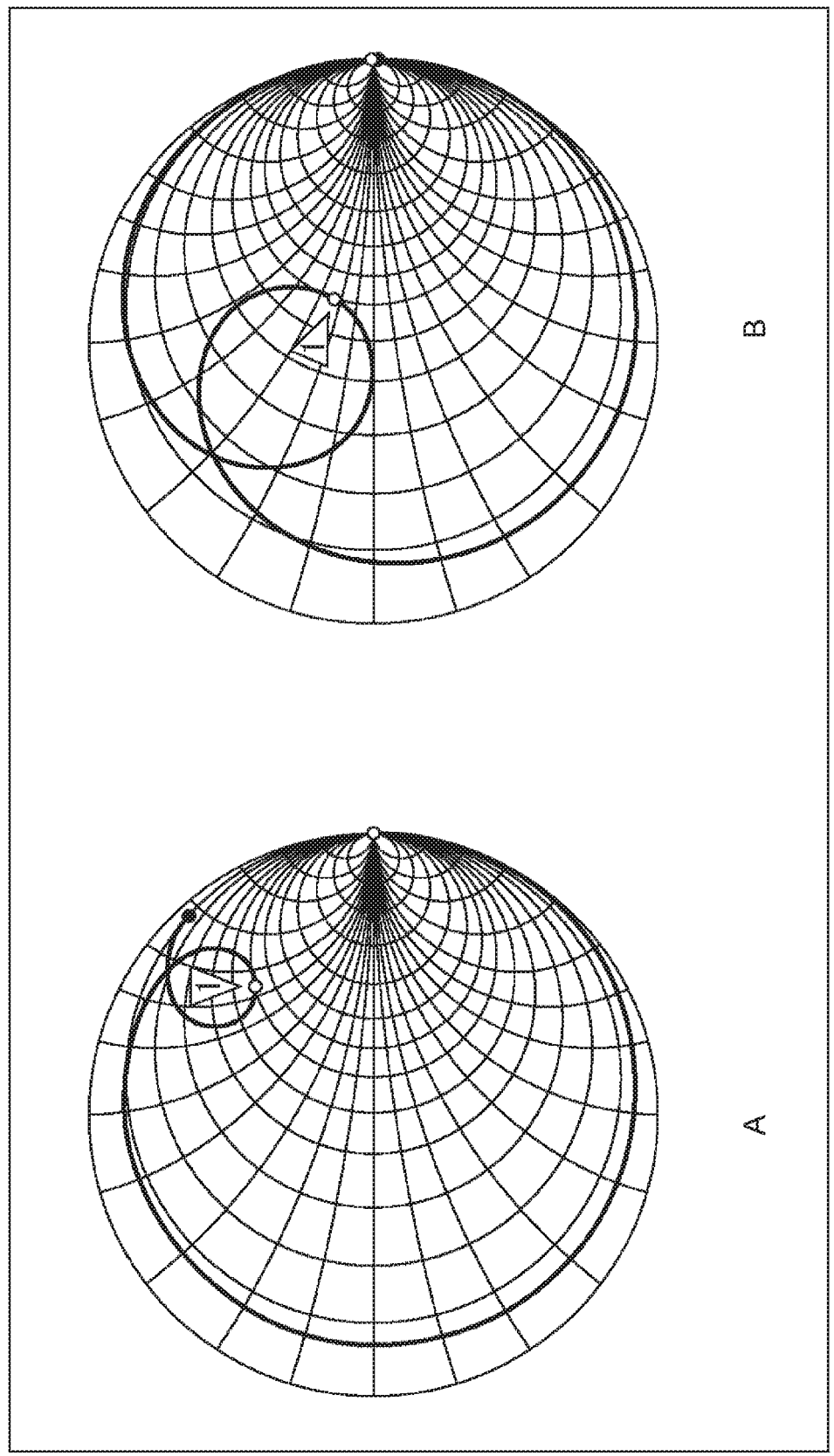
FIG. 14 is a flowchart for explaining an exemplary flow of a control process.

For example, in a case where the transmission apparatus 101 is used in combination with the antenna apparatus 142, if the impedance adaptation unit 182 adapts the impedance of the antenna element 151 with the impedance of the transmission unit 181, the impedance on the antenna side (the impedance of the antenna element 151) is positioned at a location deviated from the center, as indicated by a triangle in a Smith chart in A of FIG. 14.

On the other hand, when the impedance adaptation unit 182 adapts the impedance of the antenna element 151 and the coupled antenna element 161 with the impedance of the transmission unit 181 as described above, the impedance on the antenna side (the impedance of the antenna element 151 and the coupled antenna element 161) moves closer to the center than in the case of A of FIG. 14, as indicated by a triangle in a Smith chart in B of FIG. 14. In this manner, the impedance adaptation unit 182 can adapt the impedance on the antenna side and the impedance of the transmission unit 181 to a larger extent under the control of the control unit 185. Accordingly, a reduction in communication characteristics can be further suppressed.

As described above, since the control unit 185 controls adaptation of impedance (shifts the impedance to be matched) according to the detection result of the antenna apparatus 142, the impedance adaptation unit 182 can adapt the impedance more properly in both of a case where the transmission apparatus 101 is used alone and a case where the transmission apparatus 101 is used in combination with the antenna apparatus 142.

In other words, the transmission apparatus 101 can adapt the impedance more properly under more diverse environments. Accordingly, it is possible to suppress a reduction in communication characteristics under more diverse environments.

Note that, instead of the detection result of the antenna apparatus 142 by the antenna element detection unit 184 as described above, the switches 211 and 212 of the impedance adaptation unit 182 may be shifted to each other on the basis of the detection result of impedance misadaptation by a directional coupler. For example, the directional coupler may be provided between the impedance adaptation unit 182 and the transmission unit 181 such that impedance misadaptation is detected by this directional coupler and, in a case where impedance misadaptation is detected, the control unit 185 shifts the switches 211 and 212 to each other. In addition, the control unit 185 may shift the switches 211 and 212 to each other on the basis of both the detection result of impedance misadaptation by the directional coupler and the detection result of the antenna apparatus 142 by the antenna element detection unit 184 as described above.

<Positional Relationship Between Communication Apparatus and Antenna Apparatus>

Figure 15:
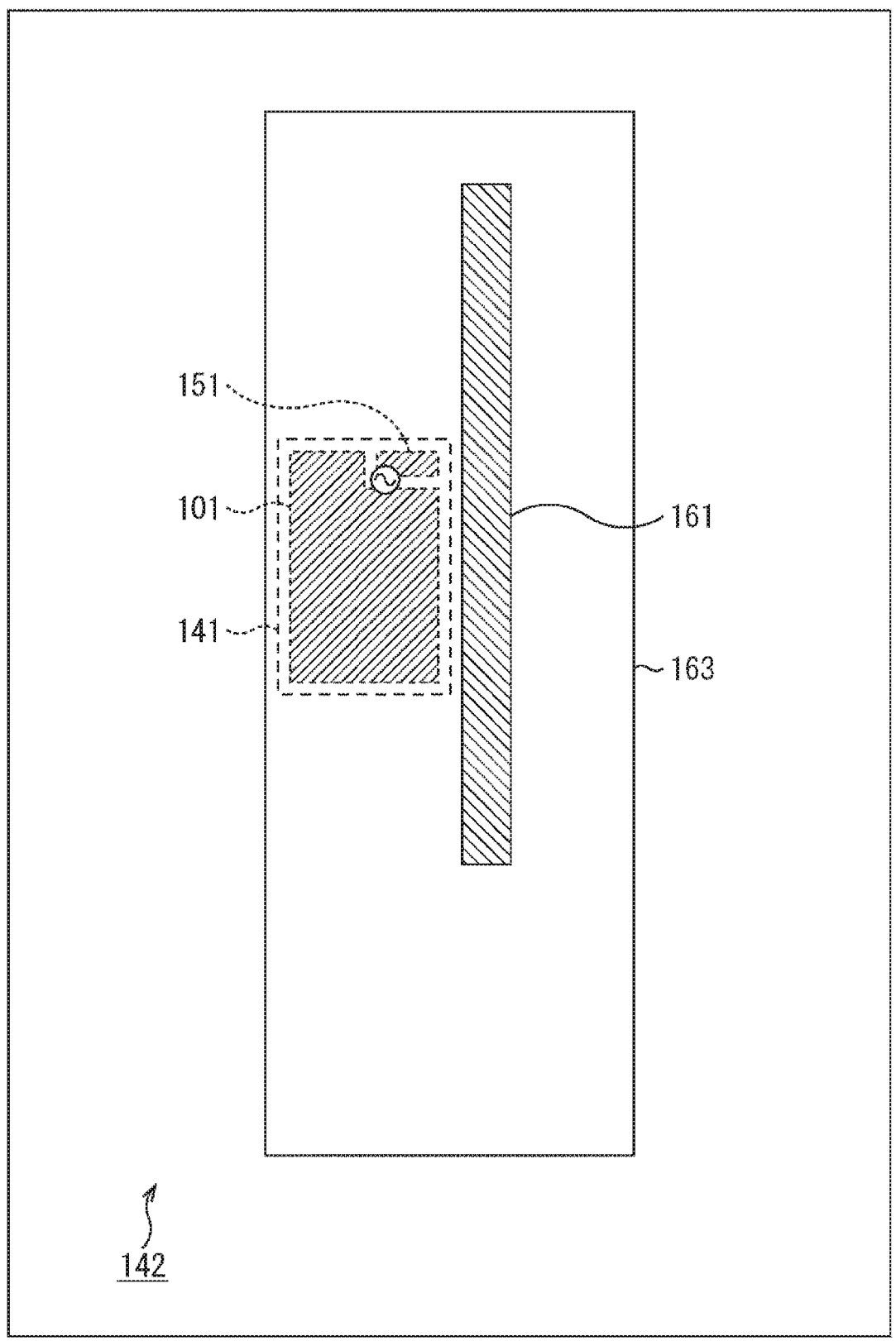
FIG. 15 explains an example of how impedance adaptation is controlled.

Incidentally, the transmission apparatus 101 may be designed in such a manner that the antenna element 151 thereof is positioned in the vicinity of a portion other than the end portion of the coupled antenna element 161 of the antenna apparatus 142. For example, as illustrated in FIG. 15, the transmission apparatus 101 may be designed in such a manner that the antenna element 151 thereof is positioned in the vicinity of a center portion of the coupled antenna element 161. In other words, the transmission apparatus 101 and the antenna apparatus 142 may be arranged so as to be side by side in parallel in the vicinity of each other.

Figure 16:
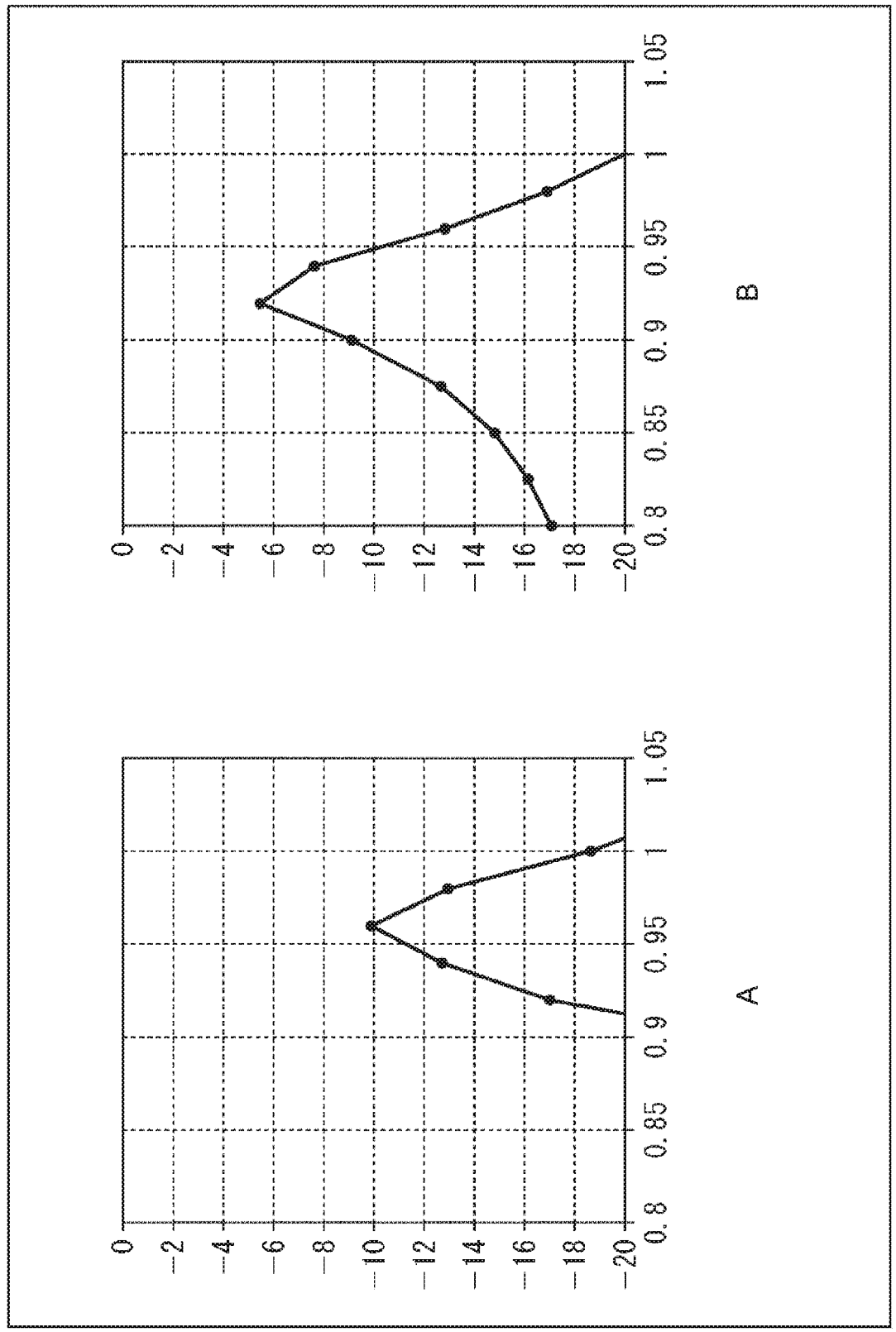
FIG. 16 is a diagram illustrating an example of radiation efficiency.

However, the radiation efficiency in that case is as illustrated in A of FIG. 16. On the other hand, as in the example in FIG. 8, in a case where the transmission apparatus 101 and the antenna apparatus 142 are arranged such that the antenna element 151 is positioned in the vicinity of the end portion of the coupled antenna element 161, a more efficient radiation efficiency than in the case of A of FIG. 16 (that is, a case where the transmission apparatus 101 and the antenna apparatus 142 are arranged in parallel) can be obtained as illustrated in B of FIG. 16.

2. Second Embodiment

<Anti-Theft System>

The above description has explained the position notification system 100 as an example, but the present technology can be applied to any communication system. For example, the transmission apparatus 101 may be placed not only on a person but also on a moving body or the like.

Figure 17:
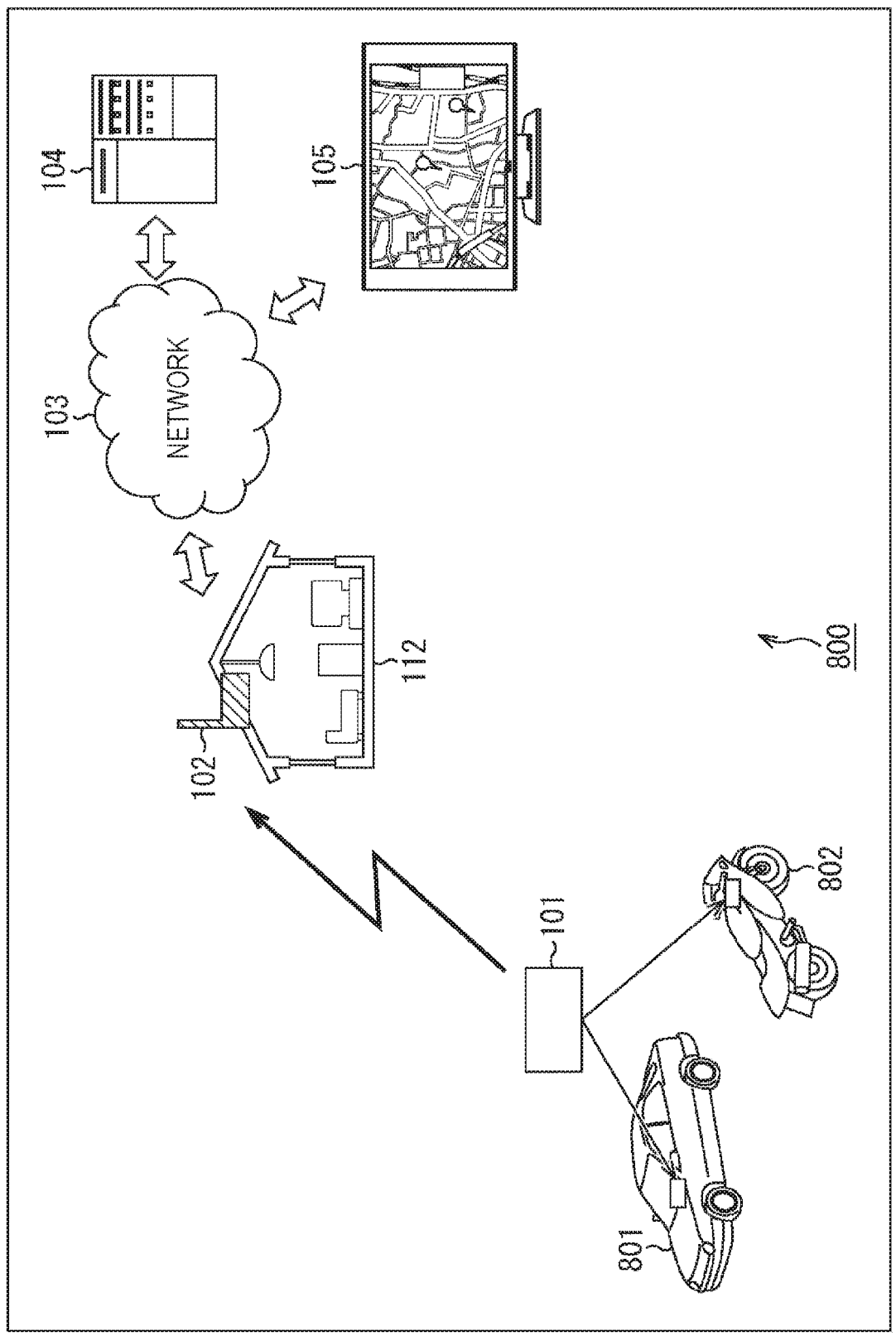
FIG. 17 is a diagram illustrating an exemplary main configuration of an anti-theft system.

For example, the present technology can also be applied to an anti-theft system 800 for preventing theft of automobiles, motorcycles, and the like as illustrated in FIG. 17. In the case of this anti-theft system 800, the transmission apparatus 101 is placed on a target object whose position is to be monitored by the user, for example, an automobile 801 and a motorcycle 802 owned by the user. As in the case of the position notification system 100, the transmission apparatus 101 notifies the high-sensitivity reception apparatus 102 of its own position information (that is, the position information of the automobile 801 and the motorcycle 802) as necessary. In other words, the user can access the server 104 from the terminal apparatus 105 to grasp the positions of the automobile 801 and the motorcycle 802 as in the case of the position notification system 100. Accordingly, even in the case of theft, the user can grasp the positions of the automobile 801 and the motorcycle 802, such that the user can easily retrieve these automobile 801 and motorcycle 802.

In the case of such an anti-theft system 800 as well, the present technology can be applied to the transmission apparatus 101 as in the case of the position notification system 100. Then, by applying the present technology, it is possible to suppress a reduction in communication characteristics.

<Other Communication Systems>

Note that the transmitted and received information is arbitrary. For example, the transmission unit 181 of the transmission apparatus 101 may generate transmission information including identification information of images, audio, measurement data, equipment, and the like, setting information of parameters, control information such as commands, and the like. In addition, this transmission information may include a plurality of types of information, for example, an image and audio or the identification information, the setting information, and the control information.

Furthermore, the transmission unit 181 may be enabled to generate the transmission information including, for example, information supplied from another apparatus. For example, the transmission unit 181 may generate the transmission information including information (sensor output) output from various types of sensors that perform detection, measurement, or the like on an arbitrary variable or the amount of a change therein, such as an image, light, luminosity, saturation, electricity, sound, vibration, acceleration, speed, angular velocity, force, temperature (not a temperature distribution), humidity, a distance, an area, a volume, a shape, a flow rate, time of the day, a time, magnetism, a chemical substance, or odor.

In other words, the present technology can be applied to a system used for arbitrary use such as three-dimensional shape measurement, space measurement, object observation, movement deformation observation, biometric observation, authentication processing, monitoring, autofocus, imaging control, illumination control, tracking processing, input/output control, electronic equipment control, and actuator control, for example.

Meanwhile, the present technology can be applied to a system in arbitrary fields such as traffic, medical care, crime prevention, agriculture, livestock industry, mining, beauty, factory, household appliance, meteorology, and natural surveillance, for example. For example, the present technology can be applied also to a system that picks up an image used for viewing purposes, using a digital camera, mobile equipment with a camera function, or the like. In addition, for example, the present technology can be applied also to a system used for traffic purposes, such as an in-vehicle system that picks up images of the front, back, surroundings, inside, and the like of an automobile for, for example, safe driving such as automatic stop and recognition of the state by the driver, a surveillance camera system that monitors traveling vehicles and roads, and a distance measuring system that measures a distance between vehicles, and the like. Furthermore, for example, the present technology can be applied also to a system used for security purposes, using a surveillance camera for crime prevention uses, a camera for person authentication uses, and the like. Additionally, for example, the present technology can be applied also to a system used for sports purposes, using various types of sensors or the like available for sports uses, such as wearable cameras. Moreover, for example, the present technology can be applied also to a system used for agricultural purposes, using various types of sensors such as cameras for monitoring the condition of fields and crops. In addition, for example, the present technology can be applied also to a system used for livestock industry purposes, using various types of sensors for monitoring the condition of domestic animals such as pigs and cattle. Furthermore, the present technology can be applied also to a system that monitors natural conditions such as volcanoes, forests, and oceans, for example, a meteorological observation system that observes weather, atmospheric temperature, humidity, wind speed, sunshine time, and the like, for example, a system that observes the ecology of wildlife such as birds, fish, reptiles, amphibians, mammals, insects, plants, and the like, for example.

<Communication Apparatus>

Furthermore, the specifications of wireless signals and information to be transmitted and received are arbitrary. In addition, the above description has explained examples of applying the present technology to the transmission apparatus and the antenna apparatus, but a reception apparatus that receives a signal or a transmission/reception apparatus that transmits and receives a signal may be used instead of this transmission apparatus. In other words, the present technology can be applied to an arbitrary communication apparatus and also can be applied to an antenna apparatus positioned in the vicinity of the arbitrary communication apparatus and excited by a wireless signal transmitted or received by this communication apparatus.

<Computer>

A series of the above-described processes can be executed by hardware as well and also can be executed by software. In a case where the series of processes is executed by software, for example, the control unit 185 of the transmission apparatus 101 is only required to have a configuration as a computer capable of executing the software. This computer includes, for example, a computer built into dedicated hardware, a general-purpose computer capable of executing arbitrary functions when installed with various types of programs, and the like.

Figure 18:
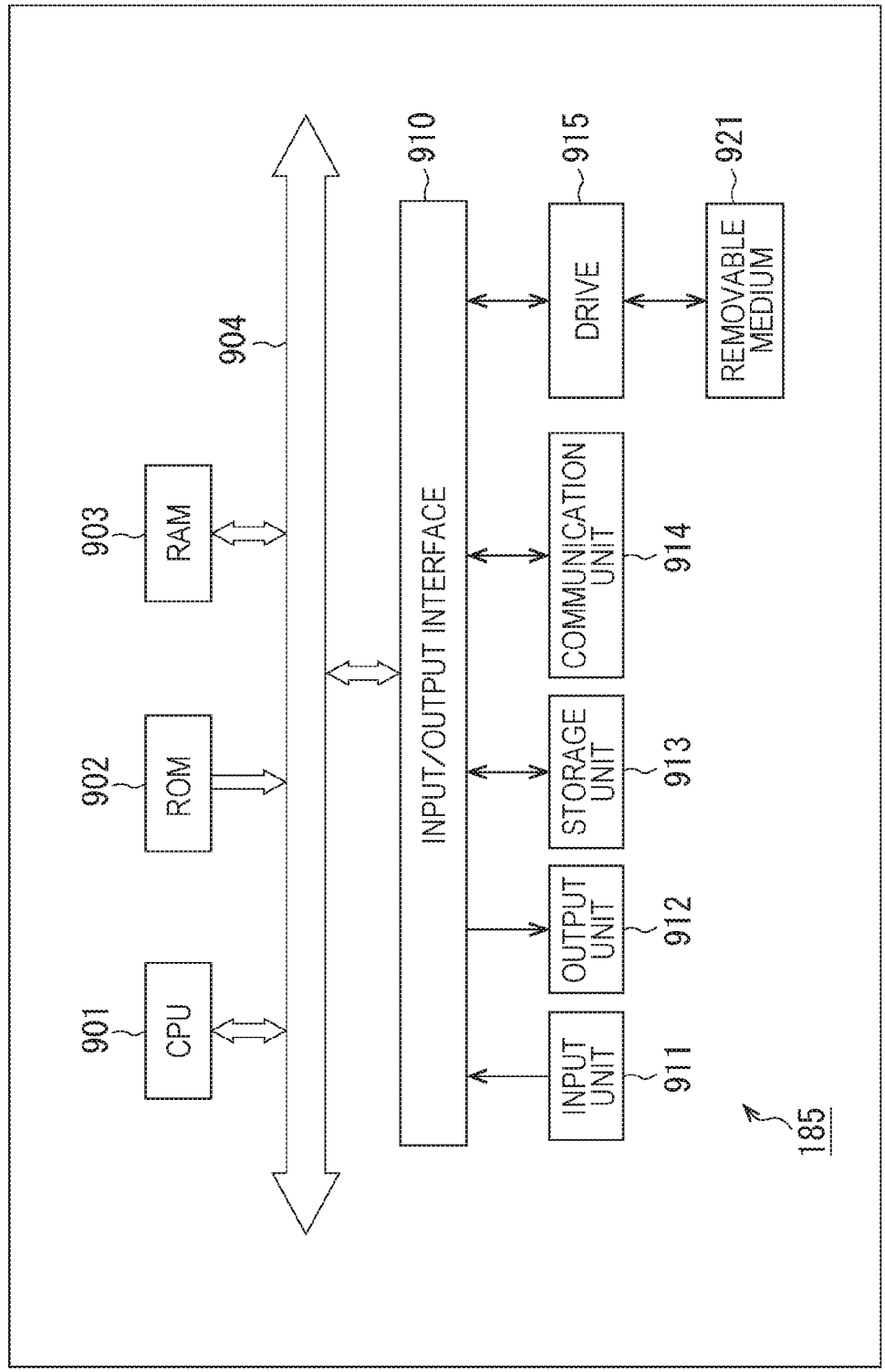
FIG. 18 is a block diagram illustrating an exemplary main configuration of a control unit.

FIG. 18 is a block diagram illustrating an exemplary configuration of the control unit 185 in that case.

The control unit 185 illustrated in FIG. 18 has a configuration as a computer as described above and has a central processing unit (CPU) 901, a read only memory (ROM) 902, a random access memory (RAM) 903, and a bus 904. The CPU 901, the ROM 902, and the RAM 903 are mutually connected via the bus 904.

Additionally, an input/output interface 910 is connected to the bus 904. An input unit 911, an output unit 912, a storage unit 913, a communication unit 914, and a drive 915 are connected to the input/output interface 910.

The input unit 911 has an arbitrary input device such as a keyboard, a mouse, a touch panel, an image sensor, a microphone, a switch, and an input terminal, for example. The output unit 912 has an arbitrary output device such as a display, a speaker, and an output terminal, for example. The storage unit 913 has an arbitrary storage medium such as a non-volatile memory, for example, a hard disk, a RAM disk, a solid state drive (SSD), a universal serial bus (USB) memory, and the like. The communication unit 914 has a communication interface conforming to an arbitrary communication standard for wired or wireless communication or the both, such as Ethernet (registered trademark), Bluetooth (registered trademark), USB, high-definition multimedia interface (HDMI) (registered trademark), and infrared data association (IrDA), for example. The drive 915 drives a removable medium 921 having an arbitrary storage medium such as a magnetic disk, an optical disc, a magneto-optical disk, or a semiconductor memory.

In the computer configured as described above, for example, a series of the above-described processes is performed in such a manner that the CPU 901 loads a program stored in the storage unit 913 to the RAM 903 via the input/output interface 910 and the bus 904 to execute. Data required by the CPU 901 when executing the various types of the processes, and so on are also stored in the RAM 903 as necessary.

For example, the program executed by the computer (CPU 901) can be applied by being recorded in the removable medium 921 serving as a package medium or the like. In that case, the program can be installed to the storage unit 913 via the input/output interface 910 by mounting the removable medium 921 in the drive 915.

In addition, this program can be also provided via a wired or wireless transfer medium such as a local area network, the Internet, or digital satellite broadcasting. In that case, the program can be received by the communication unit 914 to be installed to the storage unit 913.

As an alternative manner, this program also can be installed to the ROM 902 or the storage unit 913 in advance.

Note that a part of a series of the above-described processes also can be executed by hardware and the others can be executed by software.

<Others>

The embodiments according to the present technology are not limited to the aforementioned embodiments and various modifications can be made without departing from the scope of the present technology.

In addition, for example, the present technology can be also carried out as any configuration constituting an apparatus or a system, for example, a processor serving as system large scale integration (LSI) or the like, a module using a plurality of processors or the like, a unit using a plurality of modules or the like, a set in which another function is further added to a unit, or the like (that is, a partial configuration of an apparatus).

Note that, in the present description, the system refers to a collection of a plurality of constituent members (e.g., apparatuses and modules (components)) and whether all the constituent members are arranged within the same cabinet is not regarded as important. Accordingly, a plurality of apparatuses accommodated in separate cabinets so as to be connected to one another via a network and one apparatus of which a plurality of modules is accommodated within one cabinet are both deemed as systems.

Additionally, for example, a configuration described as one apparatus (or a processing unit) may be divided so as to be configured as a plurality of apparatuses (or processing units). Conversely, in the aforementioned cases, a configuration described as a plurality of apparatuses (or processing units) may be integrated so as to be configured as one apparatus (or one processing unit). In addition, as a matter of course, a configuration other than those described above may be employed to be added to the configurations of the respective apparatuses (or the respective processing units). Furthermore, a part of the configuration of a certain apparatus (or a certain processing unit) may be included in the configuration of another apparatus (or another processing unit) as long as the configuration or the action of the system as a whole is maintained substantially unchanged.

Meanwhile, for example, the present technology can employ a cloud computing configuration in which one function is divided and allocated to a plurality of apparatuses so as to be processed in coordination thereamong via a network.

In addition, for example, the above-described program can be executed by an arbitrary apparatus. In that case, that apparatus is only required to have necessary functions (function blocks or the like) such that necessary information can be obtained.

Furthermore, for example, the respective steps described in the aforementioned flowchart can be executed by a plurality of apparatuses each taking a share thereof as well as executed by a single apparatus. Additionally, in a case where a plurality of processes is included in one step, the plurality of processes included in one step can be executed by a plurality of apparatuses each taking a share thereof as well as executed by a single apparatus.

Note that, the program executed by the computer may be designed in such a manner that the processes of steps describing the program are executed along the time series in accordance with the order described in the present description, or individually executed in parallel or at a necessary timing, for example, when called. In other words, as long as there is no inconsistency, the processes of the respective steps may be executed in an order different from the order described above. Furthermore, the processes of the steps describing this program may be executed in parallel with a process of another program, or may be executed in combination with a process of another program.

Note that, as long as there is no inconsistency, each of a plurality of the present technologies described in the present description can be independently carried out alone. As a matter of course, it is also possible to carry out an arbitrary plurality of the present technologies at the same time. For example, the present technology described in any of the embodiments can be carried out in combination with the present technology described in another embodiment. In addition, an arbitrary one of the present technologies described above can be carried out with another technology not mentioned above at the same time.

Note that the present technology can be also configured as described below.

(1) A communication apparatus that performs wireless communication via an antenna element, the communication apparatus including:

a detection unit that detects a coupled antenna element positioned in the vicinity of the communication apparatus;

a control unit that controls adaptation of impedance on the basis of a detection result of the coupled antenna element by the detection unit;

an adaptation unit that adapts the impedance on the basis of control of the control unit; and a communication unit that performs wireless communication via the antenna element whose impedance has been adapted by the adaptation unit.

(2) The communication apparatus according to (1), in which the control unit:

controls adaptation of the impedance so as to match impedance of the antenna element of the communication apparatus with impedance of the communication unit in a case where the detection unit does not detect the coupled antenna element positioned in the vicinity of the communication apparatus; and controls adaptation of impedance so as to match impedance of the antenna element of the communication apparatus and the coupled antenna element with impedance of the communication unit in a case where the detection unit detects the coupled antenna element positioned in the vicinity of the communication apparatus.

(3) The communication apparatus according to (1) or (2), in which the adaptation unit adjusts an inductor, a capacitor, or both the inductor and the capacitor to adapt the impedance.

(4) The communication apparatus according to any one of (1) to (3), in which the detection unit includes a surrounding environment sensor that detects a change in a predetermined parameter relating to an environment around the communication apparatus and, in a case where a change in the parameter is detected by the surrounding environment sensor, deems that the coupled antenna element positioned in the vicinity of the communication apparatus is detected.

(5) The communication apparatus according to any one of (1) to (4), in which the surrounding environment sensor includes a Hall element that detects a change in a magnetic field around the communication apparatus.

(6) The communication apparatus according to any one of (1) to (5), in which the detection unit includes a switch, a connector, or both the switch and the connector that cause an electrical change by the coupled antenna element positioned in the vicinity of the communication apparatus.

(7) The communication apparatus according to any one of (1) to (6), further including a position fixing unit that fixes the communication apparatus at a predetermined position in the vicinity of the coupled antenna element.

(8) The communication apparatus according to any one of (1) to (7), in which the position fixing unit includes a magnetic material.

(9) The communication apparatus according to any one of (1) to (8), in which the position fixing unit fixes the communication apparatus such that the antenna element of the communication apparatus and an end portion of the coupled antenna element are brought in proximity to each other.

(10) A communication method by a communication apparatus that performs wireless communication via an antenna element, the communication method including:

detecting a coupled antenna element positioned in the vicinity of the communication apparatus;

controlling adaptation of impedance on the basis of a detection result of the coupled antenna element;

adapting the impedance on the basis of the control; and performing wireless communication via the antenna element whose impedance has been adapted.

(11) An antenna apparatus including:

a coupled antenna element excited by a wireless signal from a communication apparatus positioned in the vicinity of the coupled antenna element; and a notification unit that notifies the communication apparatus that the communication apparatus is positioned in the vicinity of the antenna element.

(12) The antenna apparatus according to (11), in which the coupled antenna element is excited in a non-contact state with the communication apparatus.

(13) The antenna apparatus according to (11) or (12), in which
an electrical length of the coupled antenna element is approximately one-half of a wavelength of the wireless signal.

(14) The antenna apparatus according to any one of (11) to (13), in which
the notification unit includes a magnet and is configured to notify, by a change in a magnetic field, that the communication apparatus is positioned in the vicinity of the coupled antenna element.

(15) The antenna apparatus according to any one of (11) to (14), in which
the notification unit has a physical shape that contacts the communication apparatus to notify the communication apparatus that the communication apparatus is positioned in the vicinity of the coupled antenna element.

(16) The antenna apparatus according to any one of (11) to (15), further including an electrical conductor arranged between the coupled antenna element and the communication apparatus, and a human body.

(17) The antenna apparatus according to any one of (11) to (16), further including a position fixing unit that fixes the communication apparatus at a predetermined position in the vicinity of the coupled antenna element.

(18) The antenna apparatus according to any one of (11) to (17), in which
the position fixing unit includes a magnet.

(19) The antenna apparatus according to any one of (11) to (18), in which
the position fixing unit fixes the communication apparatus such that the antenna element of the communication apparatus and an end portion of the antenna element are brought in proximity to each other.

(20) A communication system including a communication apparatus and an antenna apparatus, in which
the antenna apparatus includes:
a coupled antenna element excited by a wireless signal from the communication apparatus positioned in the vicinity of the coupled antenna element; and
a notification unit that notifies the communication apparatus positioned in the vicinity of the coupled antenna element that the communication apparatus is positioned in the vicinity of the coupled antenna element, and
the communication apparatus includes:
a detection unit that detects the coupled antenna element positioned in the vicinity of the communication apparatus on the basis of a notification from the notification unit of the antenna apparatus;
a control unit that controls adaptation of impedance on the basis of a detection result of the coupled antenna element by the detection unit;
an adaptation unit that adapts the impedance on the basis of control of the control unit; and
a communication unit that performs wireless communication via an antenna element of the communication apparatus, or the antenna element of the communication apparatus and the coupled antenna element, the impedance of which has been adapted by the adaptation unit.

REFERENCE SIGNS LIST

100 Position notification system
101 Transmission apparatus
102 High-sensitivity reception apparatus
103 Network
104 Server
140 Jacket
141 Pocket
142 Antenna apparatus
151 Antenna element
152 Magnetic material
161 Coupled antenna element
162 Magnet
163 Reflection plate
170 Stick
181 Transmission unit
182 Impedance adaptation unit
183 Position fixing unit
184 Antenna element detection unit
185 Control unit
191 Position fixing unit
192 Proximity notification unit
201 to 203 Inductor
211 and 212 Switch
800 Anti-theft system

The invention claimed is:

1. A communication apparatus that performs wireless communication via an antenna element, the communication apparatus comprising:
detection circuitry configured to detect a coupled antenna element positioned in the vicinity of the communication apparatus;
a controller configured to control adaptation of impedance on the basis of a detection result of the coupled antenna element by the detection circuitry;
adaptation circuitry configured to adapt the impedance on the basis of control of the controller; and
communication circuitry configured to perform wireless communication via the antenna element whose impedance has been adapted by the adaptation circuitry,
wherein the detection circuitry includes a surrounding environment sensor separate from the antenna element, the surrounding environment sensor being configured to wirelessly determine that the coupled antenna element is positioned in the vicinity of the communication apparatus when a change in a wireless parameter of an environment around the communication apparatus is detected.

2. The communication apparatus according to claim 1, wherein
the controller:
controls adaptation of the impedance so as to match impedance of the antenna element of the communication apparatus with impedance of the communication circuitry in a case where the detection circuitry does not detect the coupled antenna element positioned in the vicinity of the communication apparatus; and
controls adaptation of impedance so as to match impedance of the antenna element of the communication apparatus and the coupled antenna element with impedance of the communication circuitry in a case where the detection circuitry detects the coupled antenna element positioned in the vicinity of the communication apparatus.

3. The communication apparatus according to claim 1, wherein
the adaptation circuitry adjusts an inductor, a capacitor, or both the inductor and the capacitor to adapt the impedance.

4. The communication apparatus according to claim 1, wherein
the surrounding environment sensor includes a Hall element that detects, as the change in the wireless parameter, a change in a magnetic field around the communication apparatus.

5. The communication apparatus according to claim 1, wherein
the detection circuitry includes a switch, a connector, or both the switch and the connector that cause an electrical change by the coupled antenna element positioned in the vicinity of the communication apparatus.

6. The communication apparatus according to claim 1, further comprising a position fixing unit that fixes the communication apparatus at a predetermined position in the vicinity of the coupled antenna element.

7. The communication apparatus according to claim 6, wherein
the position fixing unit includes a magnetic material.

8. The communication apparatus according to claim 6, wherein
the position fixing unit fixes the communication apparatus such that the antenna element of the communication apparatus and an end portion of the coupled antenna element are brought in proximity to each other.

9. An antenna apparatus comprising:
a coupled antenna element configured to receive a wireless communication via an antenna element of a communication apparatus positioned in the vicinity of the coupled antenna element; and
a notification unit that notifies the communication apparatus that the communication apparatus is positioned in the vicinity of the coupled antenna element via a wireless connection with a detection circuitry of the communication apparatus,
wherein the detection circuitry includes a surrounding environment sensor separate from the antenna element, the surrounding environment sensor being configured to wirelessly determine that the coupled antenna element is positioned in the vicinity of the communication apparatus when a change in a wireless parameter of an environment around the communication apparatus is detected, and
the wireless communication via the antenna element is performed according to an adapted impedance on the bases of a detection result of the coupled antenna element.

10. The antenna apparatus according to claim 9, wherein the coupled antenna element is excited in a non-contact state with the communication apparatus.

11. The antenna apparatus according to claim 9, wherein an electrical length of the coupled antenna element is approximately one-half of a wavelength of the wireless signal.

12. The antenna apparatus according to claim 9, wherein the notification unit includes a magnet and is configured to notify, by a change in a magnetic field, that the communication apparatus is positioned in the vicinity of the coupled antenna element.

13. The antenna apparatus according to claim 9, wherein the notification unit has a physical shape that contacts the communication apparatus to notify the communication apparatus that the communication apparatus is positioned in the vicinity of the coupled antenna element.

14. The antenna apparatus according to claim 9, further comprising an electrical conductor arranged between the coupled antenna element and the communication apparatus, and a human body.

15. The antenna apparatus according to claim 9, further comprising a position fixing unit that fixes the communication apparatus at a predetermined position in the vicinity of the coupled antenna element.

16. The antenna apparatus according to claim 15, wherein the position fixing unit includes a magnet.

17. The antenna apparatus according to claim 15, wherein the position fixing unit fixes the communication apparatus such that the antenna element of the communication apparatus and an end portion of the coupled antenna element are brought in proximity to each other.

18. A communication system comprising a communication apparatus and an antenna apparatus, wherein
the antenna apparatus includes:
a coupled antenna element configured to receive a wireless communication via an antenna element of a communication apparatus positioned in the vicinity of the coupled antenna element; and
a notification unit that notifies the communication apparatus that the communication apparatus is positioned in the vicinity of the coupled antenna element, and
the communication apparatus includes:
detection circuitry configured to detect the coupled antenna element positioned in the vicinity of the communication apparatus;
a controller configured to control adaptation of impedance on the basis of a detection result of the coupled antenna element by the detection circuitry;
adaptation circuitry configured to adapt the impedance on the basis of control of the controller; and
communication circuitry configured to perform wireless communication via the antenna element whose impedance has been adapted by the adaptation circuitry,
wherein the detection circuitry includes a surrounding environment sensor separate from the antenna element, the surrounding environment sensor being configured to wirelessly determine that the coupled antenna element is positioned in the vicinity of the communication apparatus when a change in a wireless parameter of an environment around the communication apparatus is detected.

* * * * *